(12) United States Patent
Huang et al.

(10) Patent No.: US 11,355,410 B2
(45) Date of Patent: Jun. 7, 2022

(54) THERMAL DISSIPATION IN SEMICONDUCTOR DEVICES

(71) Applicant: Taiwan Semiconductor Manufacturing Co., Ltd., Hsinchu (TW)

(72) Inventors: Wen-Sheh Huang, Hsinchu (TW); Yu-Hsiang Chen, Hsinchu (TW); Chii-Ping Chen, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/927,624

(22) Filed: Jul. 13, 2020

(65) Prior Publication Data

US 2021/0335690 A1  Oct. 28, 2021

Related U.S. Application Data

(60) Provisional application No. 63/016,384, filed on Apr. 28, 2020.

(51) Int. Cl.
*H01L 23/367* (2006.01)
*H01L 23/528* (2006.01)
(Continued)

(52) U.S. Cl.
CPC .... *H01L 23/367* (2013.01); *H01L 21/823821* (2013.01); *H01L 21/823871* (2013.01);
(Continued)

(58) Field of Classification Search
CPC ............ H01L 23/367; H01L 23/3171; H01L 23/5226; H01L 23/5283; H01L 23/5286;
(Continued)

(56) References Cited

U.S. PATENT DOCUMENTS 9,209,247 B2  12/2015  Colinge et al.
9,236,267 B2  1/2016  De et al.
(Continued)

FOREIGN PATENT DOCUMENTS

DE  102017118093 A1  5/2018
KR  20140035803 A  3/2014
(Continued)

*Primary Examiner* — Dao H Nguyen
(74) *Attorney, Agent, or Firm* — Slater Matsil LLP

(57) ABSTRACT

A device includes a device layer comprising a first transistor; a first interconnect structure on a front-side of the device layer; and a second interconnect structure on a backside of the device layer. The second interconnect structure includes a first dielectric layer on the backside of the device layer; a contact extending through the first dielectric layer to a source/drain region of the first transistor; a conductive line electrically connected to the source/drain region of the first transistor through the contact; and a thermal dissipation path thermally connected to the device layer, the thermal dissipation path extending to a surface of the second interconnect structure opposite the device layer. The thermal dissipation path comprises a dummy via.

20 Claims, 57 Drawing Sheets

(51) Int. Cl.
  *H01L 49/02* (2006.01)
  *H01L 23/31* (2006.01)
  *H01L 23/522* (2006.01)
  *H01L 29/78* (2006.01)
  *H01L 29/66* (2006.01)
  *H01L 21/8238* (2006.01)
  *H01L 29/775* (2006.01)
  *H01L 29/06* (2006.01)
  *H01L 27/092* (2006.01)

(52) U.S. Cl.
  CPC ...... *H01L 23/3171* (2013.01); *H01L 23/5226* (2013.01); *H01L 23/5283* (2013.01); *H01L 23/5286* (2013.01); *H01L 27/0922* (2013.01); *H01L 28/10* (2013.01); *H01L 29/0673* (2013.01); *H01L 29/66545* (2013.01); *H01L 29/66795* (2013.01); *H01L 29/775* (2013.01); *H01L 29/7851* (2013.01); *H01L 2224/0401* (2013.01)

(58) Field of Classification Search
  CPC ..... H01L 21/823821; H01L 21/823871; H01L 27/0922; H01L 28/10; H01L 29/0673; H01L 29/66545; H01L 29/66795; H01L 29/775; H01L 29/7851; H01L 2224/0401
  USPC .......................... 257/712, 288, 368, 369, 401
  See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,031,394 B1* | 6/2021 | Or-Bach ............. H01L 27/1203 |
| 2006/0145347 A1 | 7/2006 | Aida |
| 2007/0052062 A1 | 3/2007 | Ding et al. |
| 2007/0221970 A1 | 9/2007 | Kadoshima et al. |
| 2008/0176396 A1 | 7/2008 | Futase et al. |
| 2011/0186990 A1 | 8/2011 | Mawatari et al. |
| 2014/0077362 A1 | 3/2014 | Lin et al. |
| 2015/0137238 A1 | 5/2015 | Tsunemi et al. |
| 2019/0189549 A1 | 6/2019 | Jo et al. |
| 2020/0176349 A1 | 6/2020 | Hsu et al. |
| 2020/0350215 A1* | 11/2020 | Zhang ............... H01L 21/02579 |
| 2021/0043538 A1* | 2/2021 | Yan .................... H01L 21/76224 |
| 2021/0358842 A1* | 11/2021 | Huang ................ H01L 23/5286 |
| 2021/0376094 A1* | 12/2021 | Lin .................. H01L 29/66545 |
| 2021/0408249 A1* | 12/2021 | Yu ....................... H01L 21/3065 |

FOREIGN PATENT DOCUMENTS

| | | |
|---|---|---|
| KR | 20190073008 A | 6/2019 |
| TW | 201926720 A | 7/2019 |

* cited by examiner

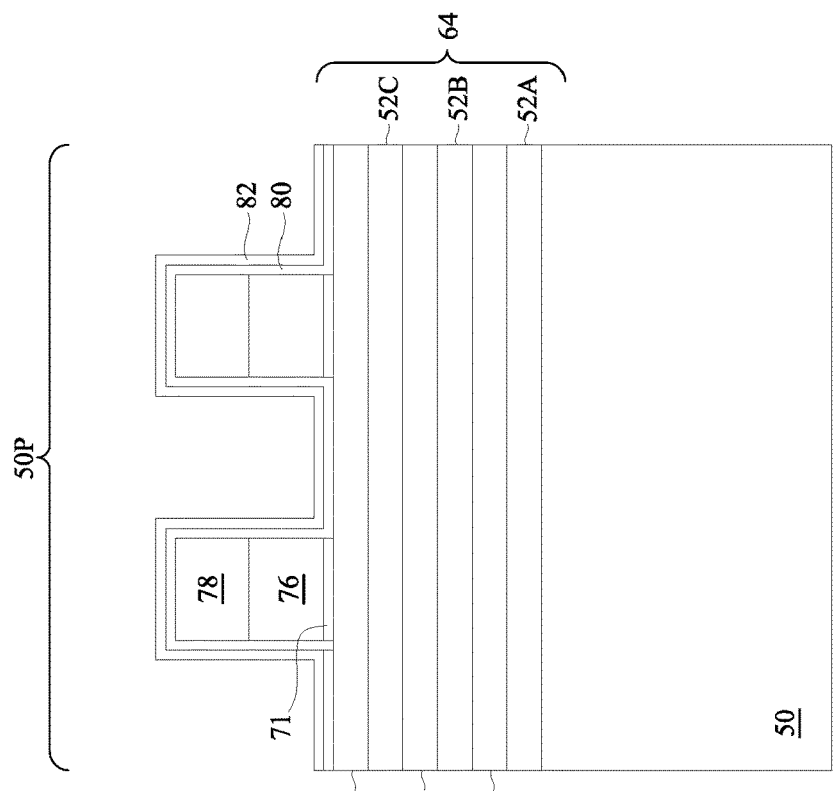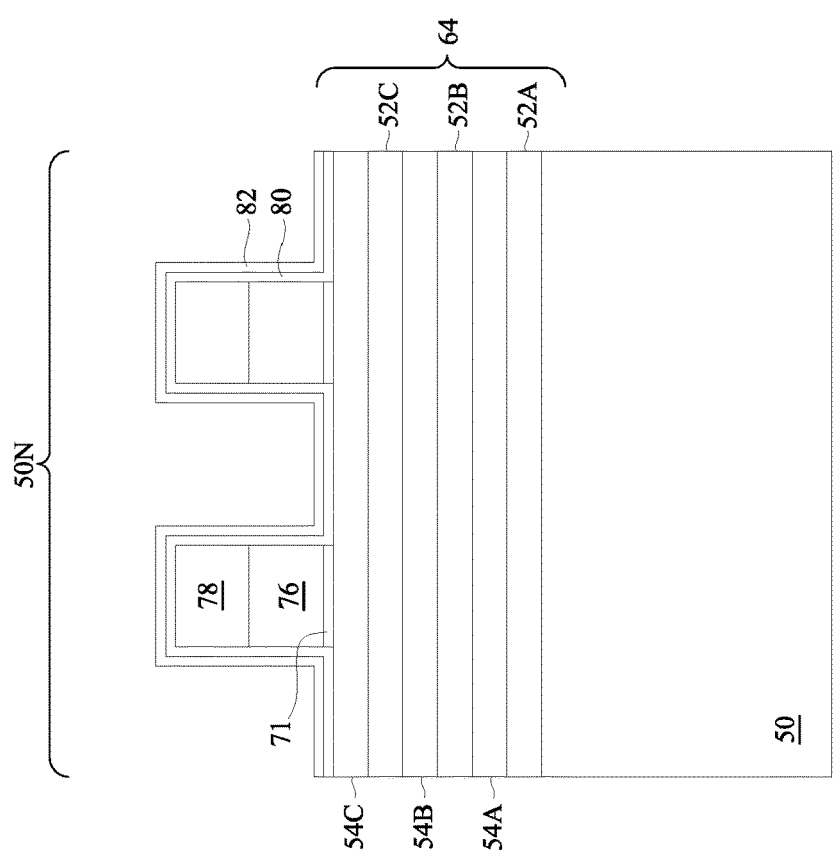
Fig. 7B

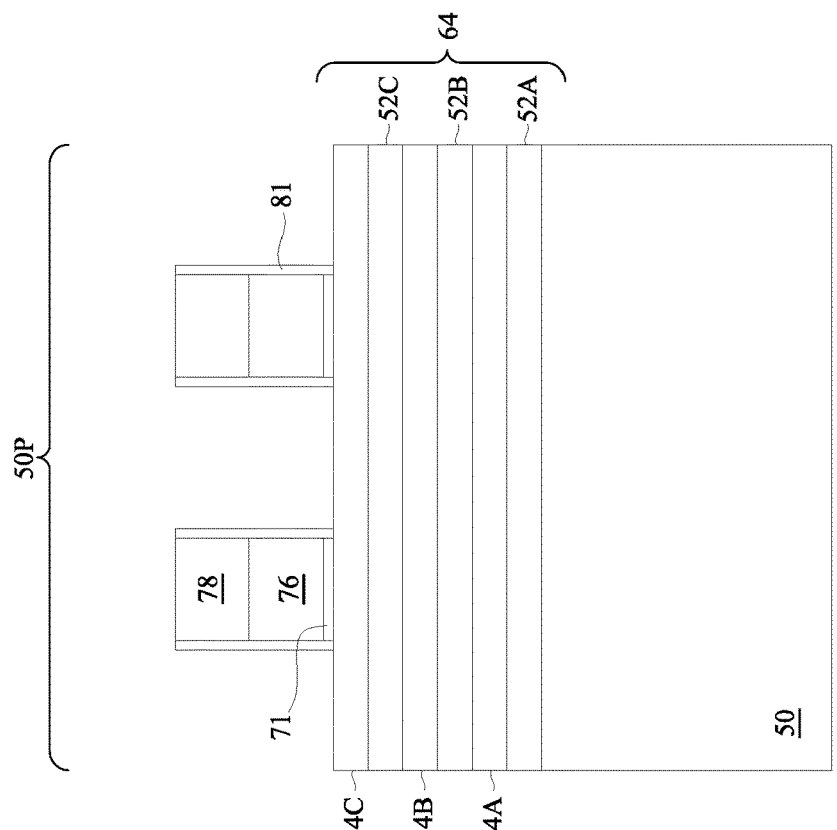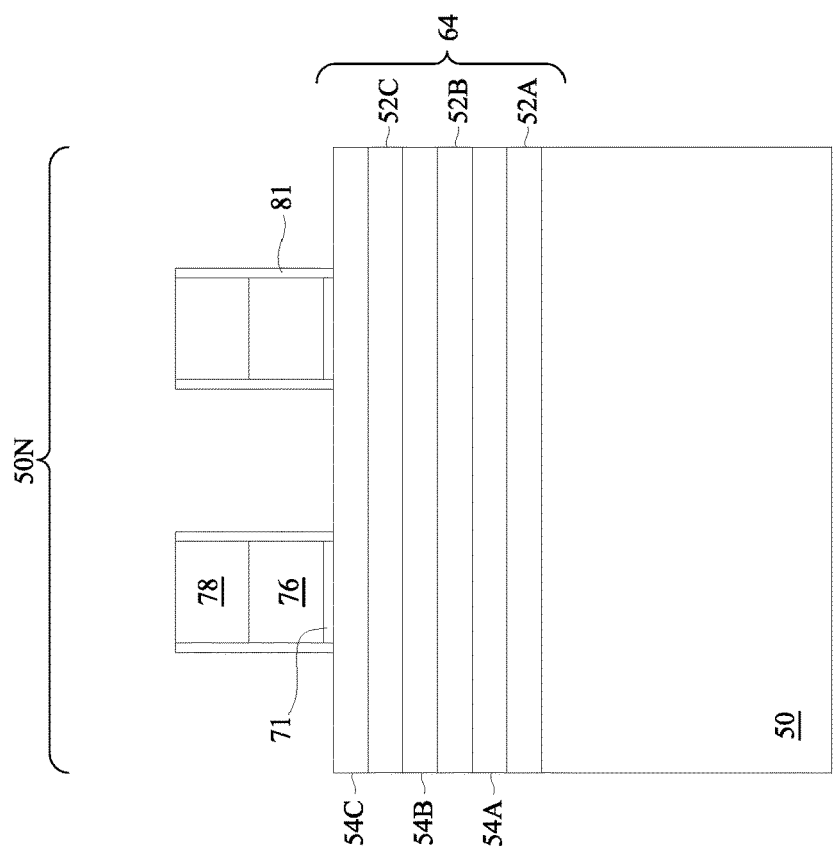
Fig. 8B

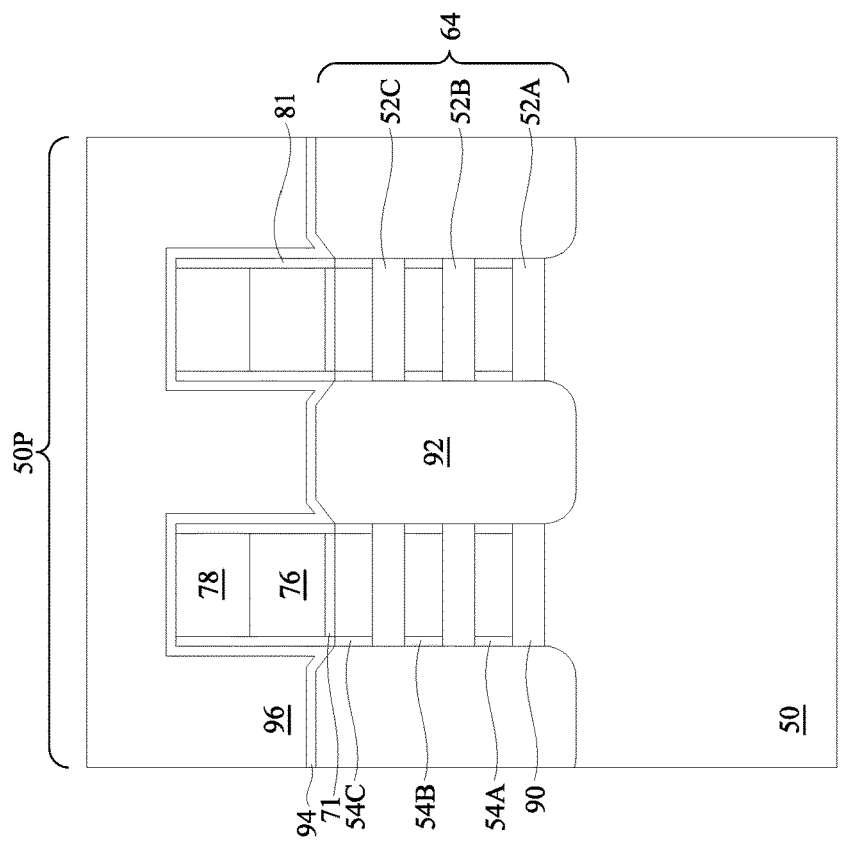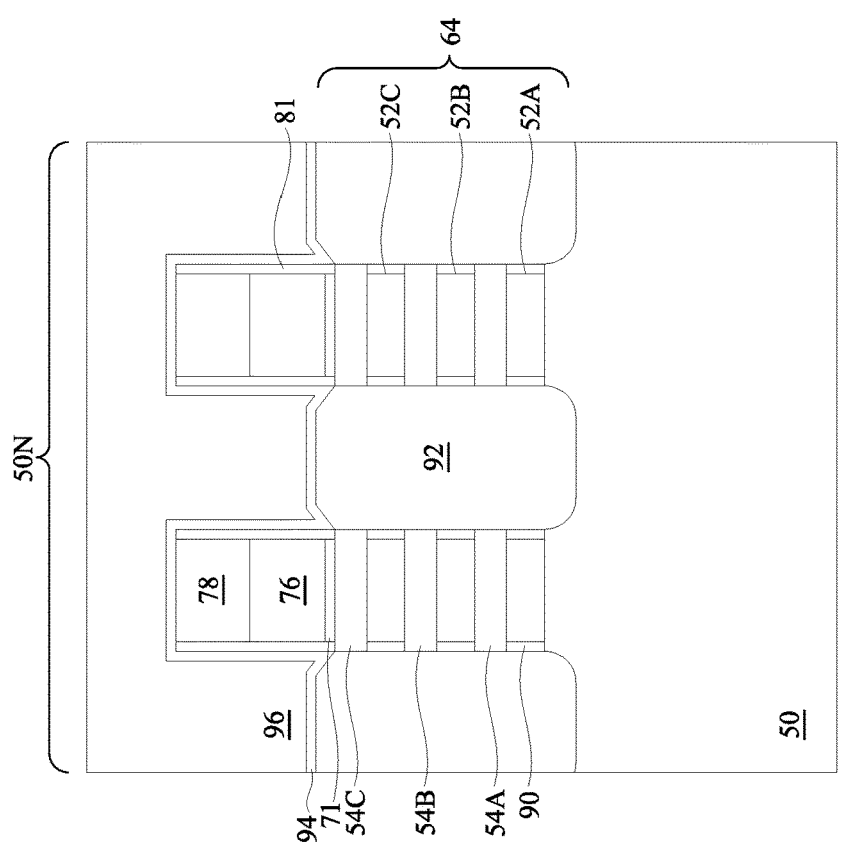
Fig. 13B

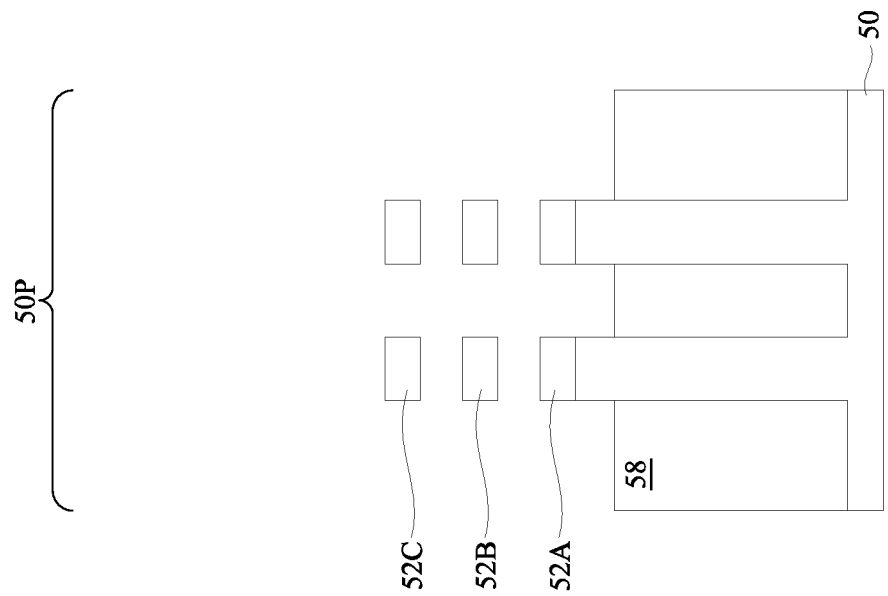
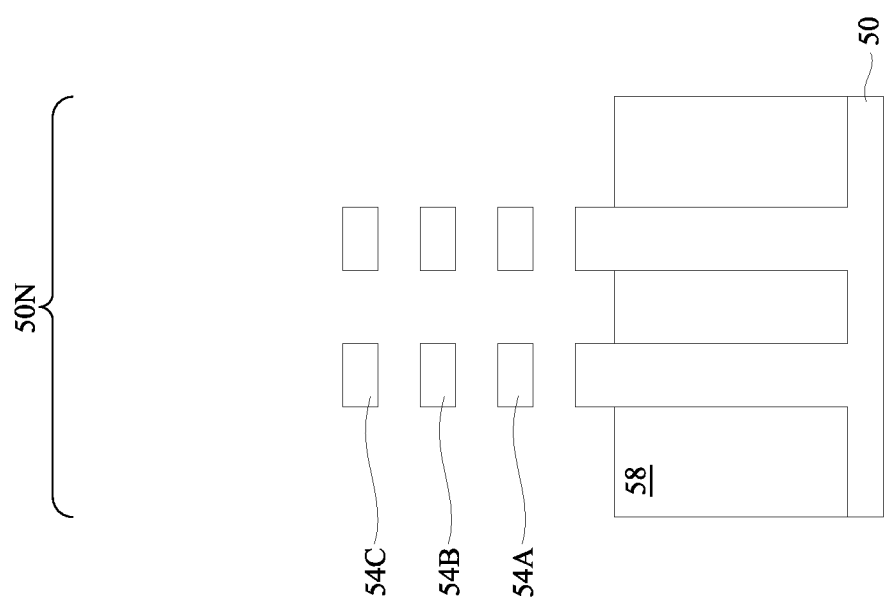
Fig. 16A

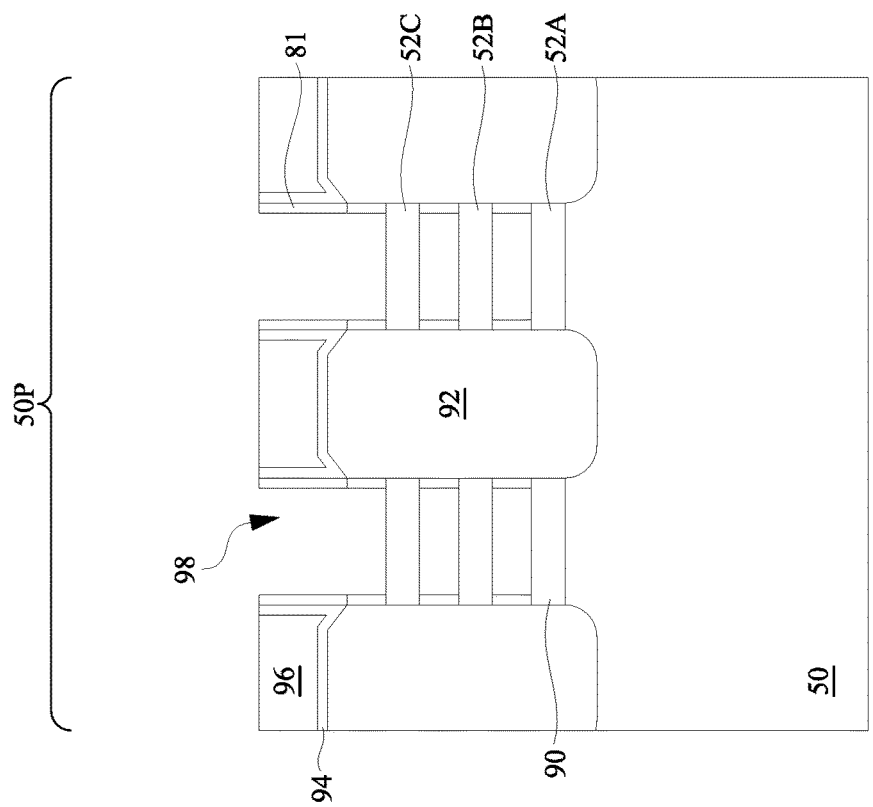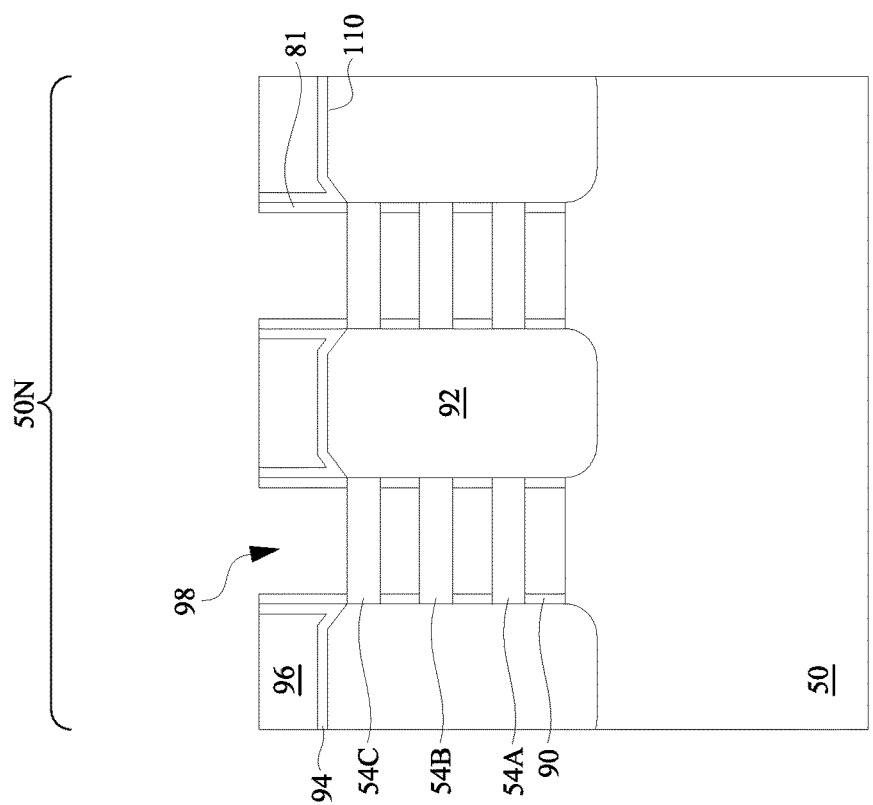
Fig. 16B

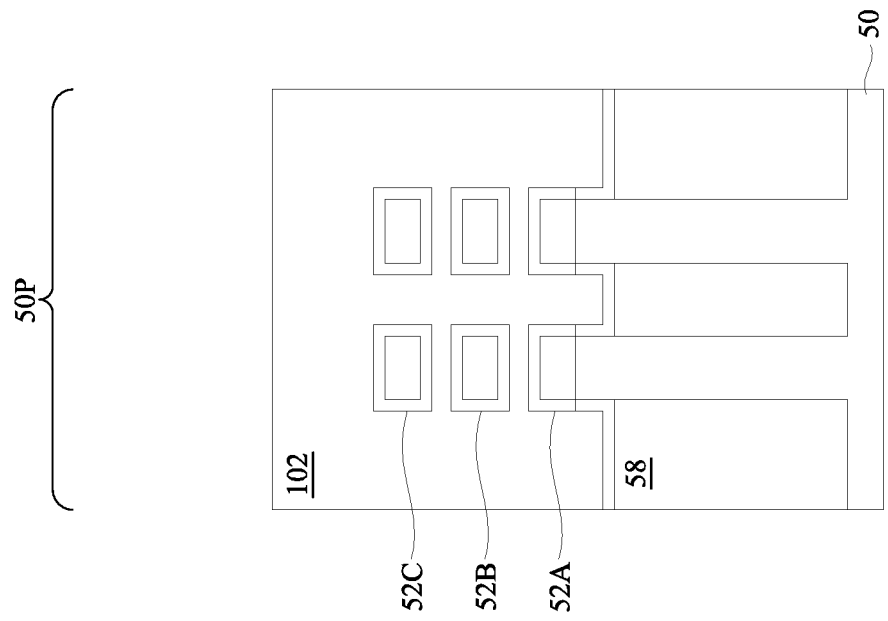
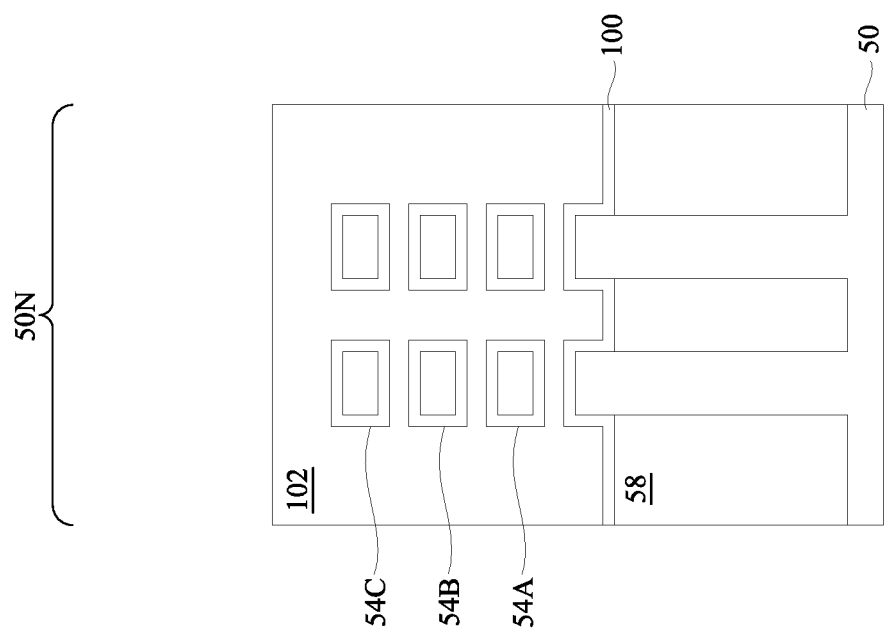
Fig. 17A

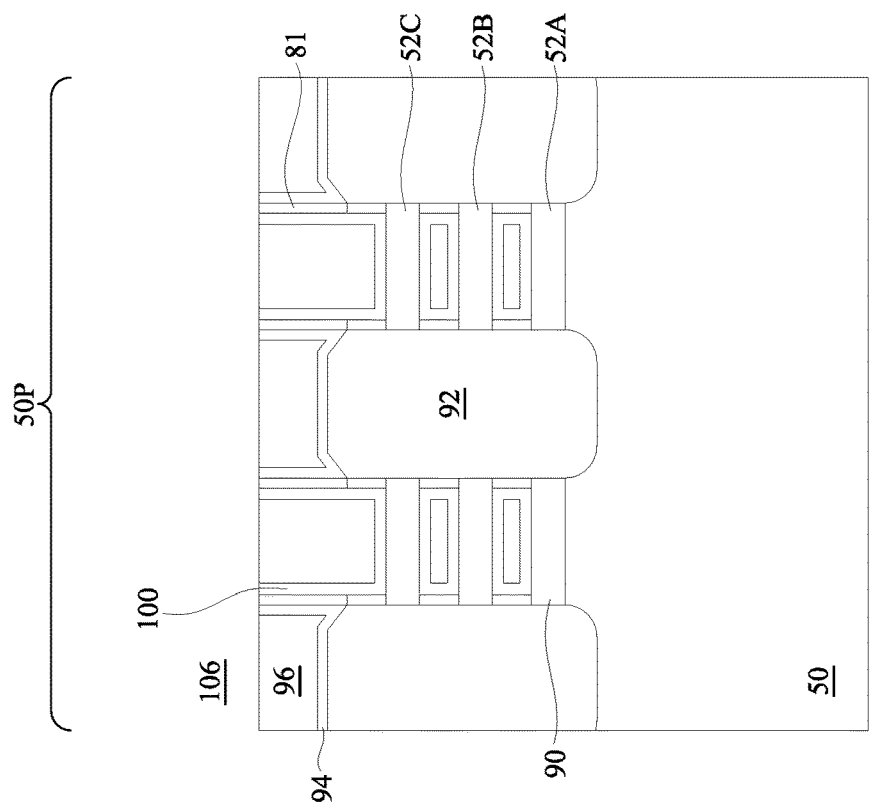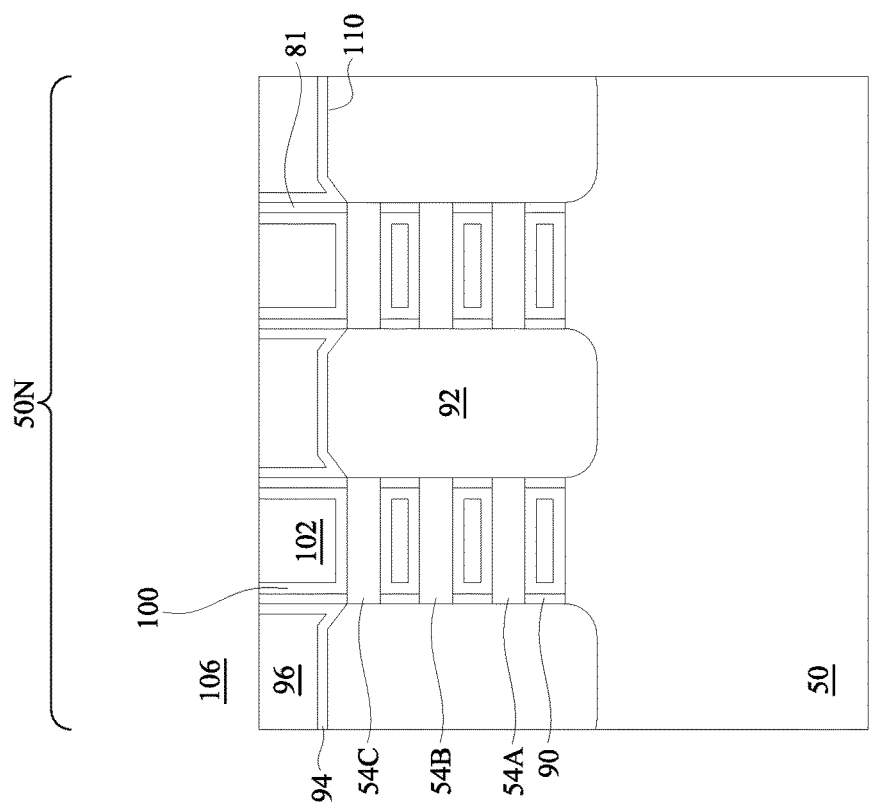
Fig. 17B

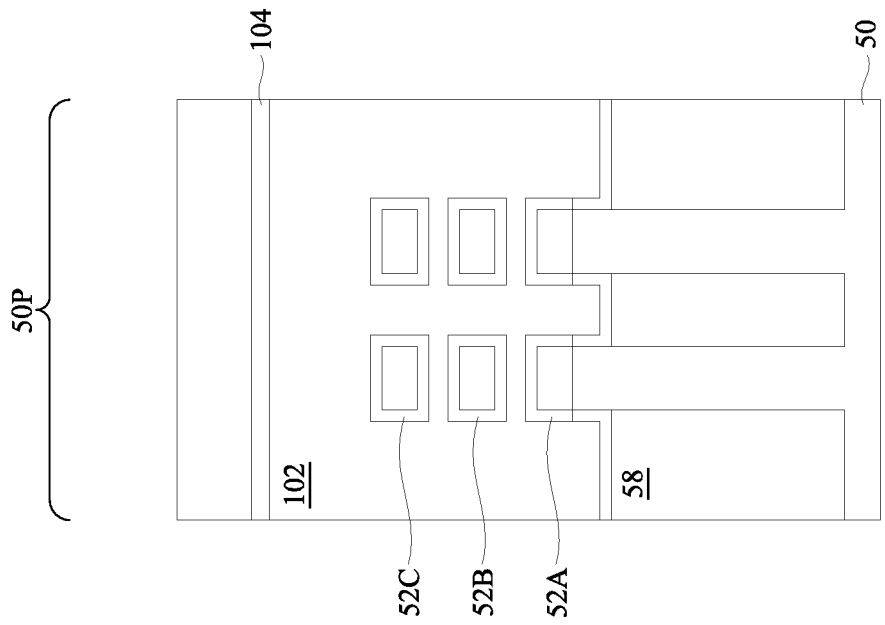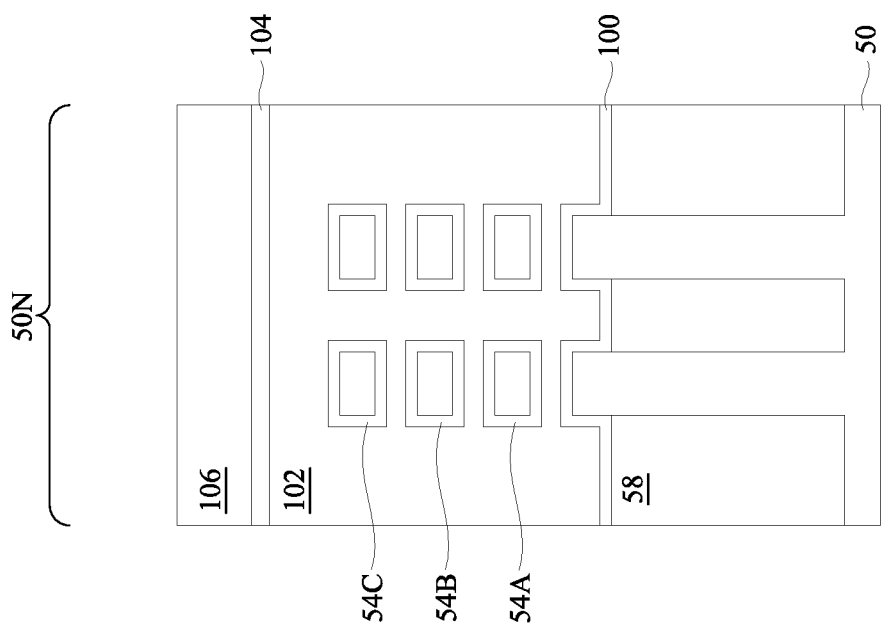
Fig. 18A

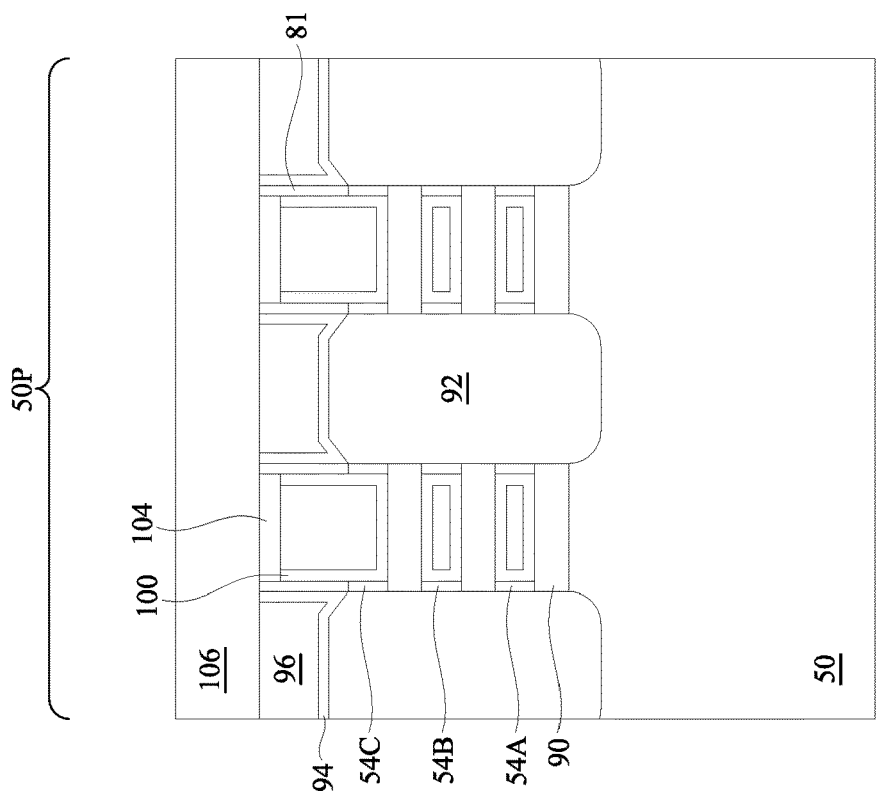
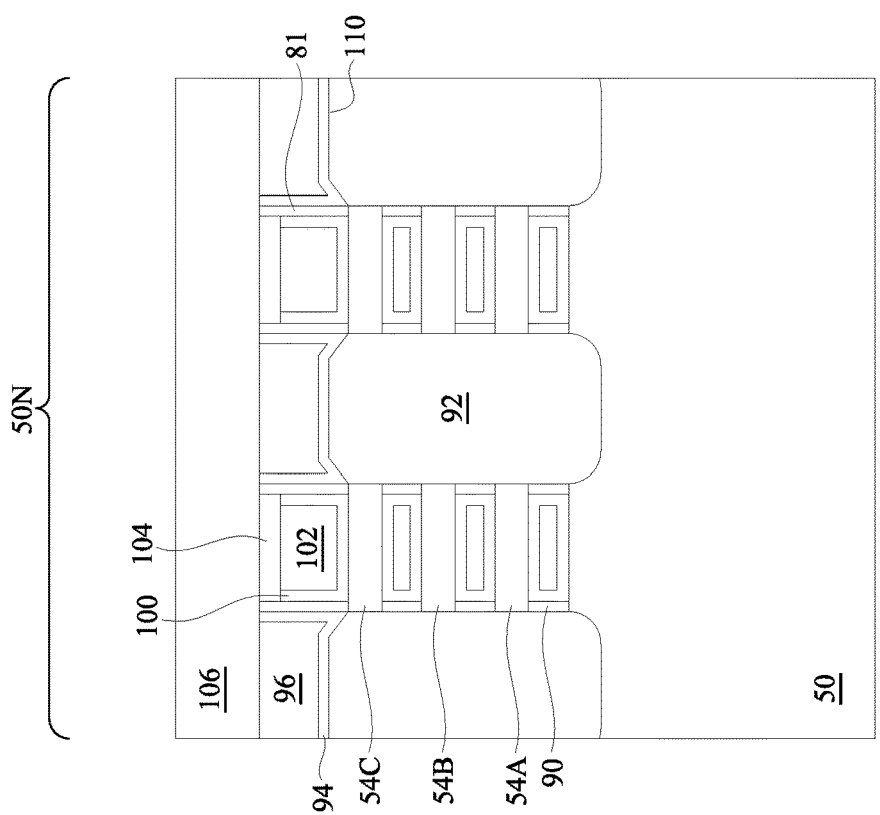
Fig. 18B

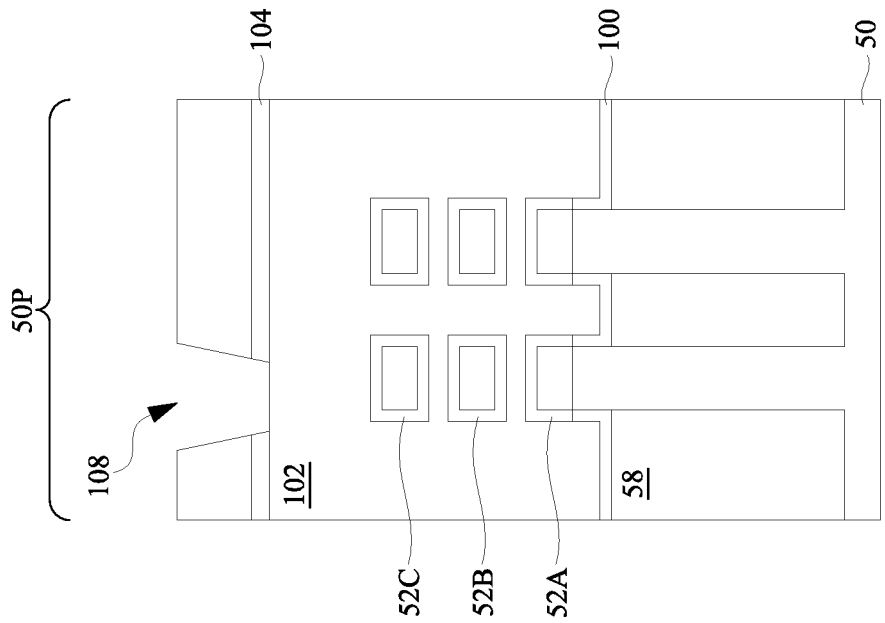
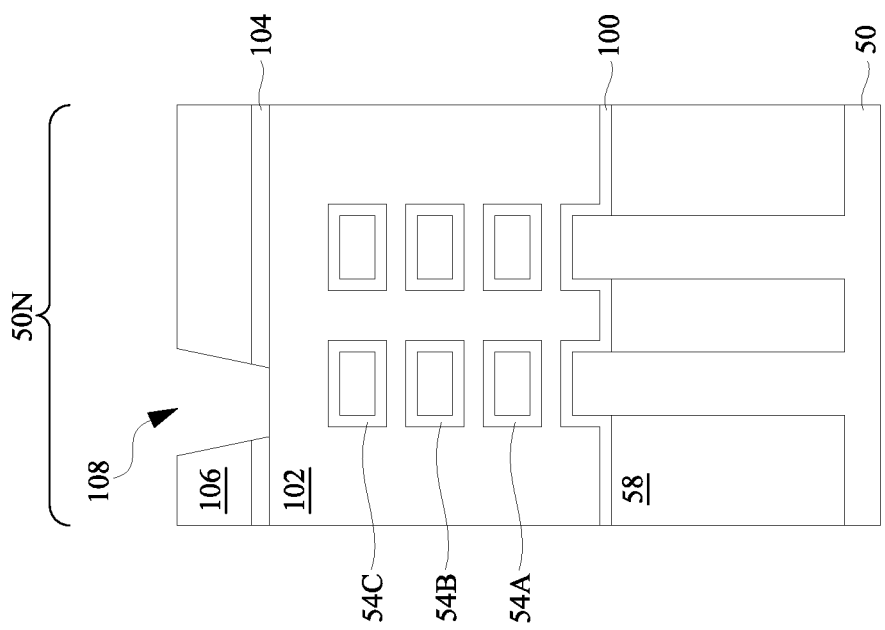
Fig. 19A

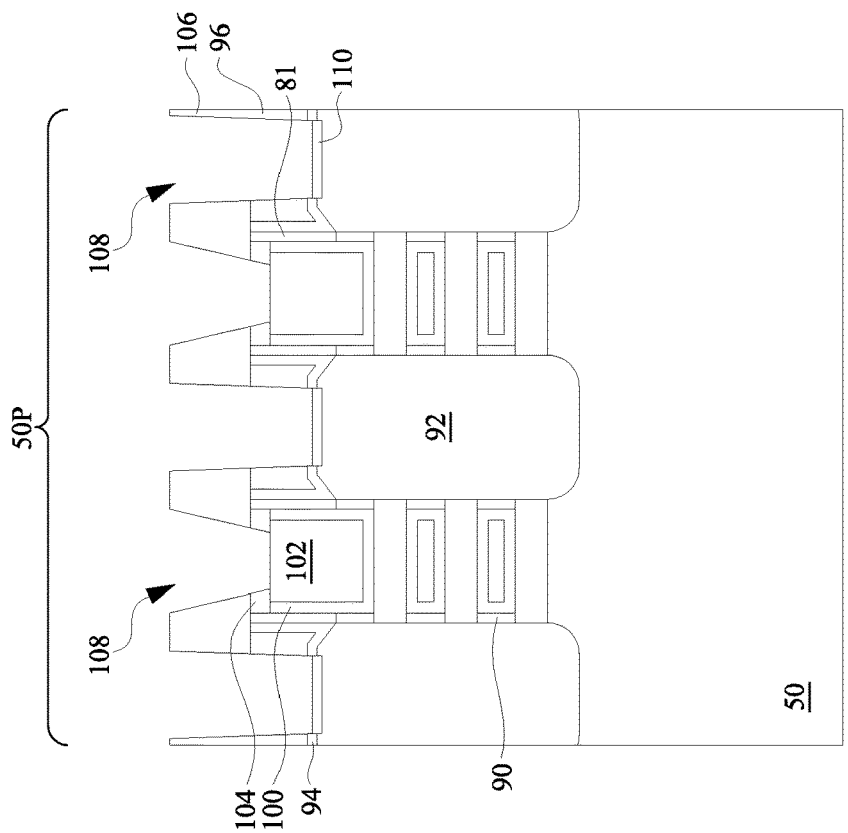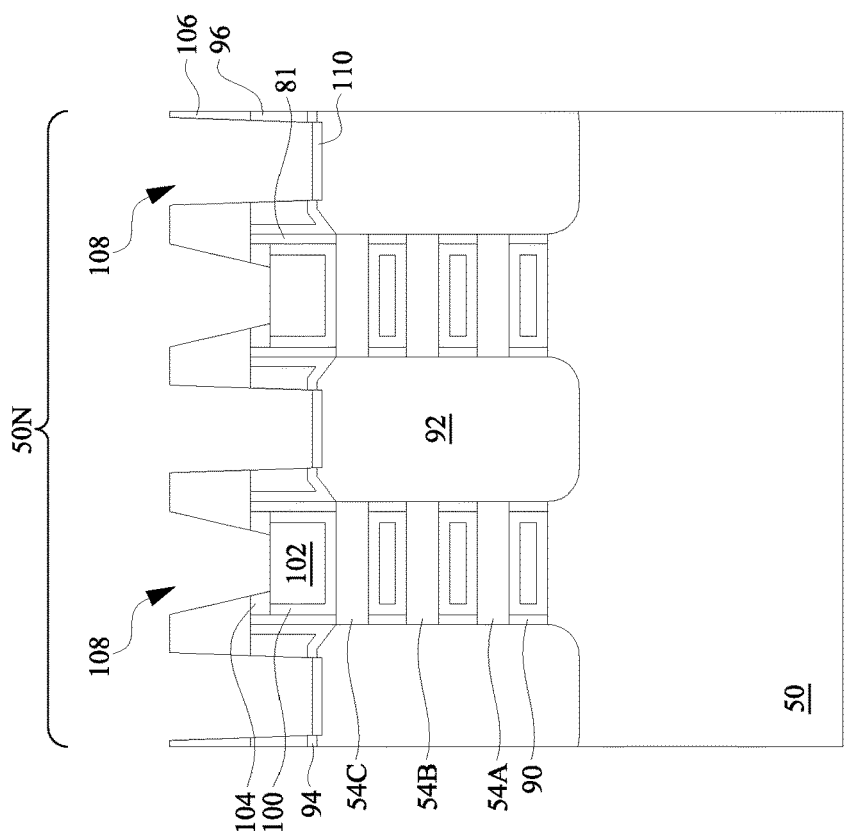
Fig. 19B

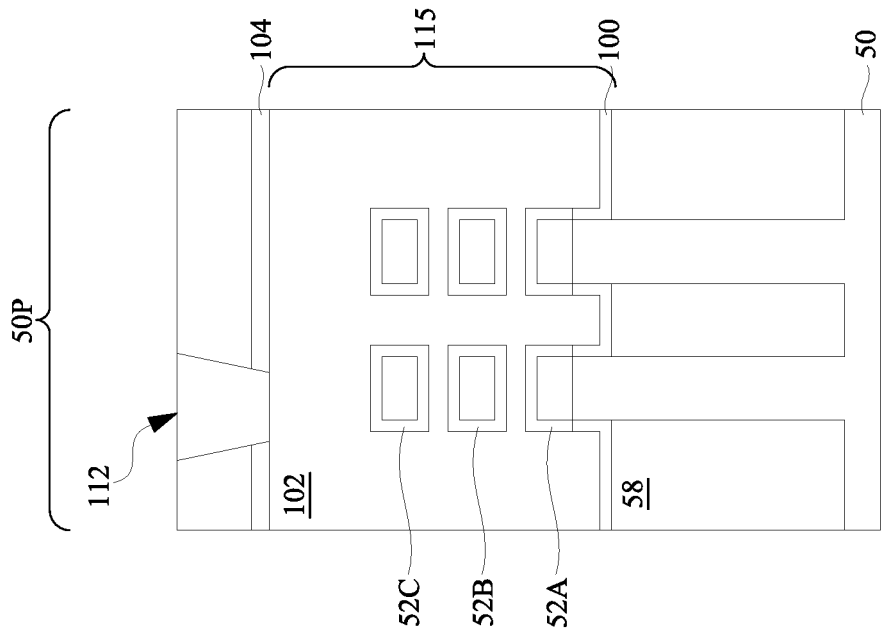
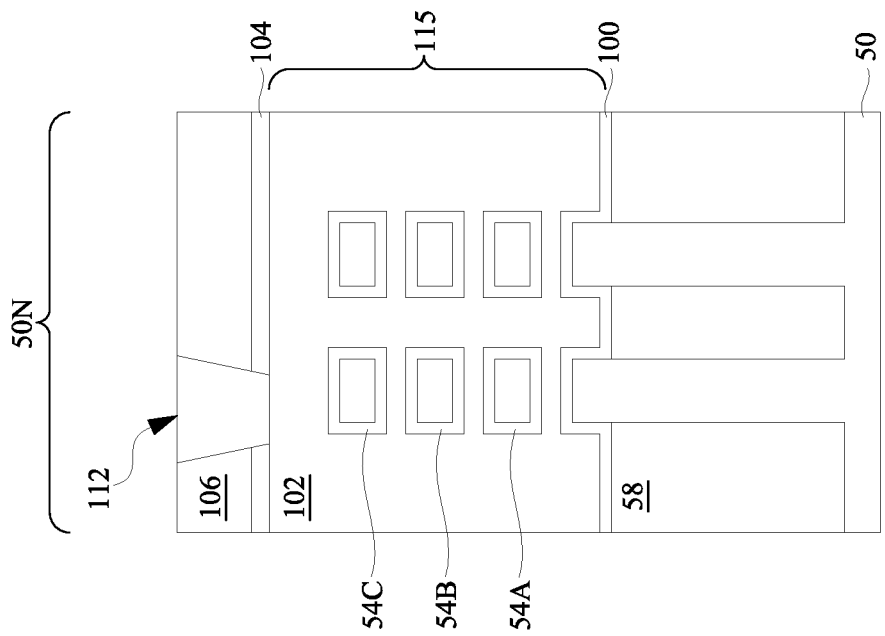
Fig. 20A

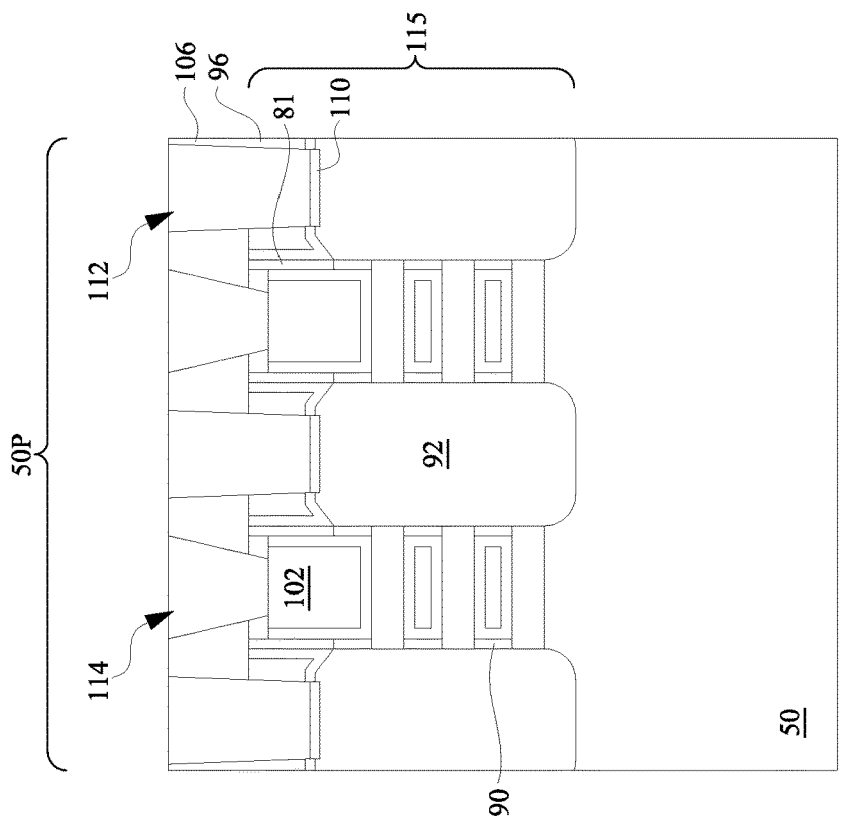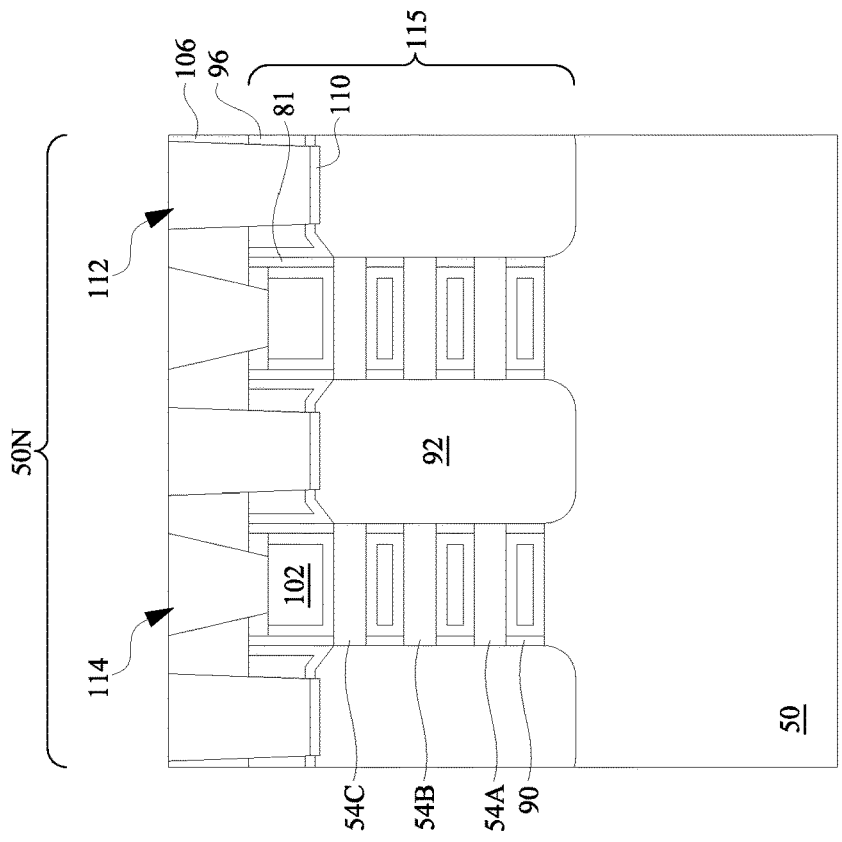
Fig. 20B

THERMAL DISSIPATION IN SEMICONDUCTOR DEVICES

PRIORITY CLAIM AND CROSS-REFERENCE

This application claims the benefit of U.S. Provisional Application No. 63/016,384, filed on Apr. 28, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 18C, 19A, 19B, 19C, 20A, 20B, 20C, 21, 22, 23, 24, 25, 26, 27, 28, 29A, 29B, and 29C are cross-sectional views of intermediate stages in the manufacturing of nano-FETs, in accordance with some embodiments.

DETAILED DESCRIPTION

Figure 1:
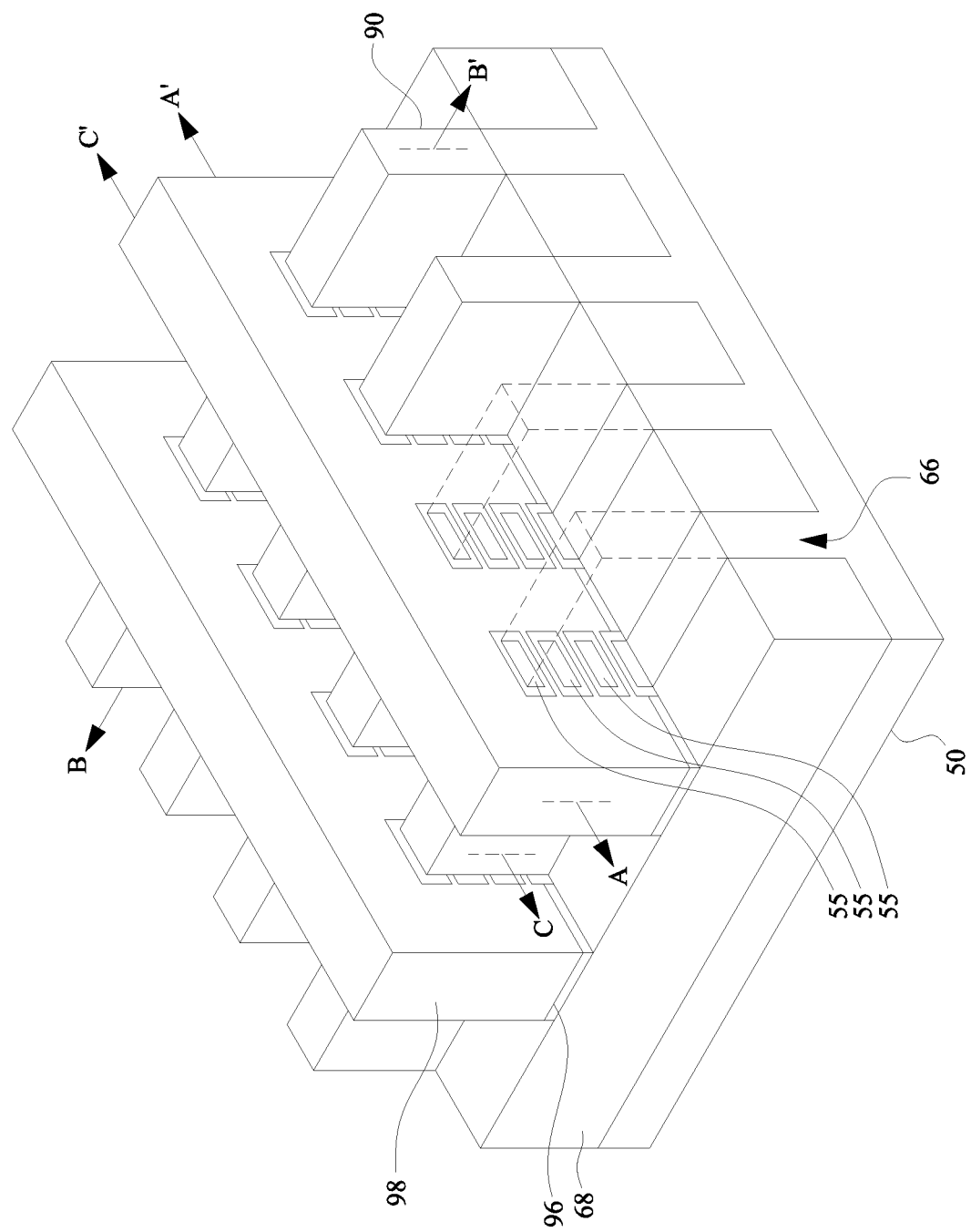
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As technology nodes shrink in advanced nodes of semiconductor devices, a temperature of the devices during operation may also increase due to reduced chip area for thermal dissipation and increased transistor density. Various embodiments provide thermal conductive paths from a device that generates heat (e.g., a transistor, resistor, or the like) to an exterior of the chip, thereby allowing for improved heat dissipation and compensating for operating temperature increases. In some embodiments, the thermal conductive paths include dummy features formed in an interconnect structure on a backside and/or front-side of a semiconductor chip.

Embodiments are described below in a particular context, a die comprising nano-FETs. Various embodiments may be applied, however, to dies comprising other types of transistors (e.g., fin field effect transistors (FinFETs), planar transistors, thin film transistors (TFTs), or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nano-structures 55 (e.g., nanosheets, nanowire, or the like) over fins 66 on a substrate 50 (e.g., a semiconductor substrate), wherein the nano-structures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 96 are over top surfaces of the fins 66 and along top surfaces, sidewalls, and bottom surfaces of the nano-structures 55. Gate electrodes 98 are over the gate dielectric layers 96. Epitaxial source/drain regions 90 are disposed on the fins 66 on opposing sides of the gate dielectric layers 96 and the gate electrodes 98.

FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 90 of a nano-FET.

Cross-section B-B' is perpendicular to cross-section A-A' and is parallel to a longitudinal axis of a fin 66 of the nano-FET and in a direction of, for example, a current flow between the epitaxial source/drain regions 90 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 20C are cross-sectional views of intermediate stages in the manufacturing of nano-FETs, in accordance with some embodiments. FIGS. 2 through 5, 6A, 13A, 14A, 15A, 16A, 17A, 18A, 19A, 20A, 29A, and 30A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21, 22, 23, 24, 25, 26, 27, 28, 29B, 30B, and 31 illustrate reference cross-section B-B' illustrated in FIG. 1. FIGS. 7A, 8A, 9A, 10A, 11A, 12A, 12C, 13C, 18C, 19C, 20C, 29C, and 30C illustrate reference cross-section C-C' illustrated in FIG. 1.

Figure 2:
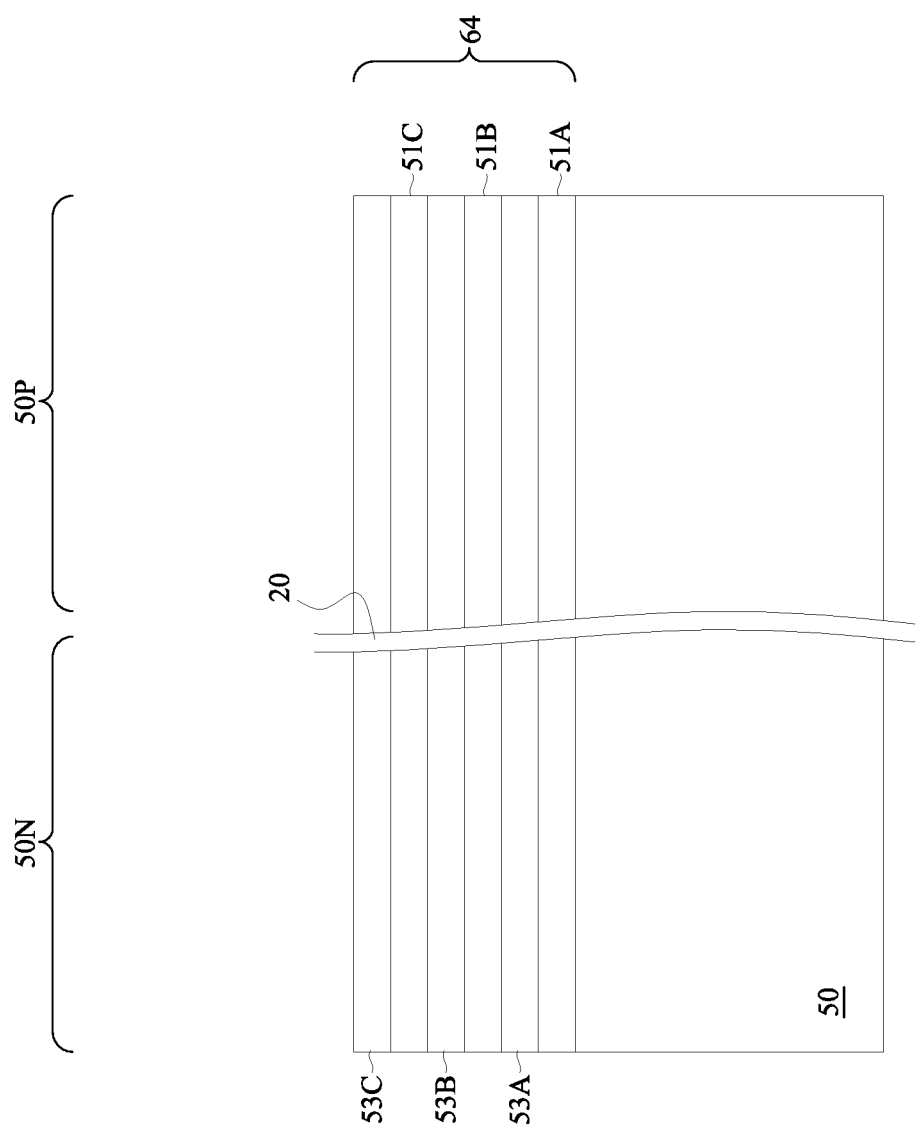

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P. In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of non-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type NSFETS. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type NSFETS.

Figure 3:
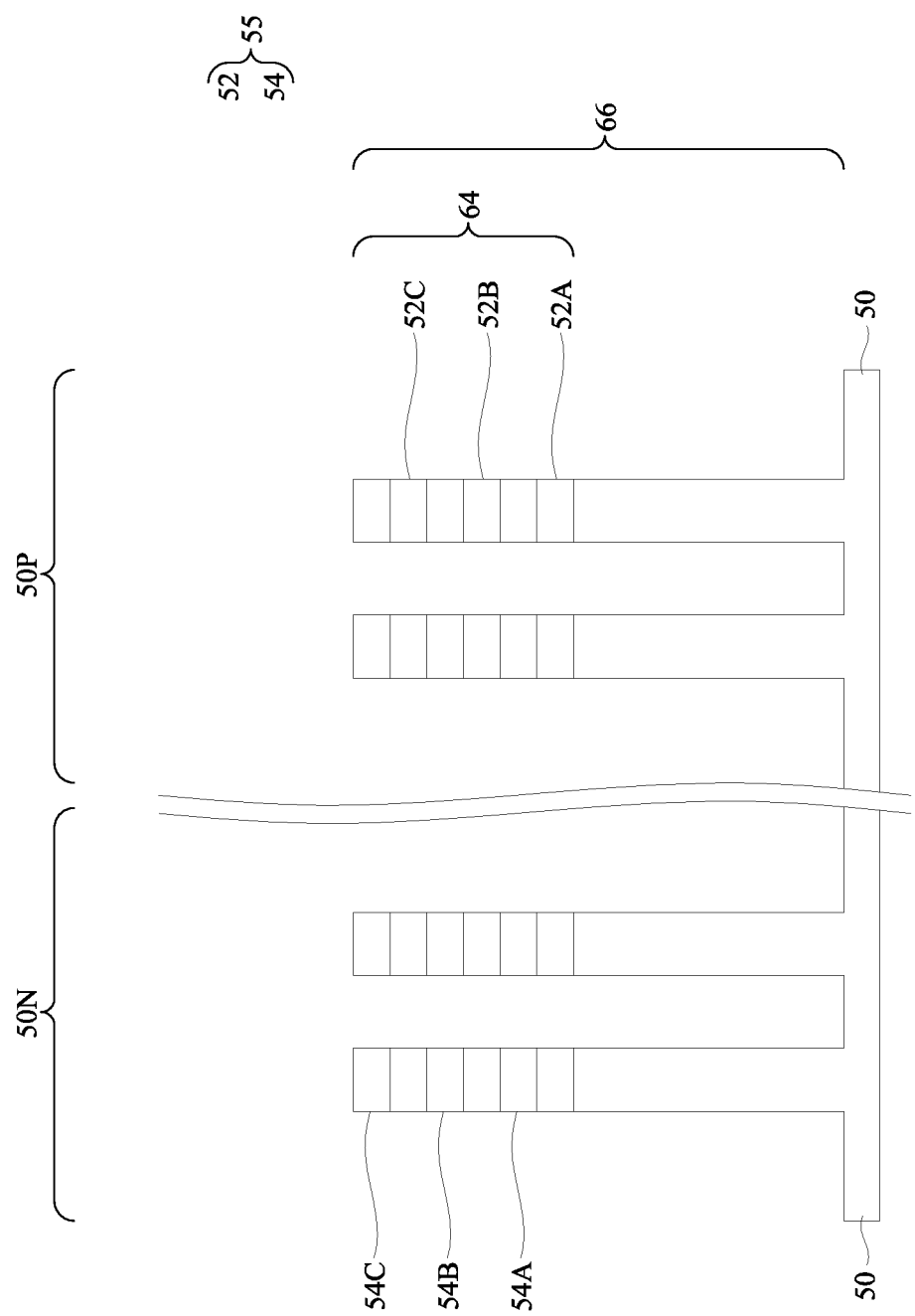

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
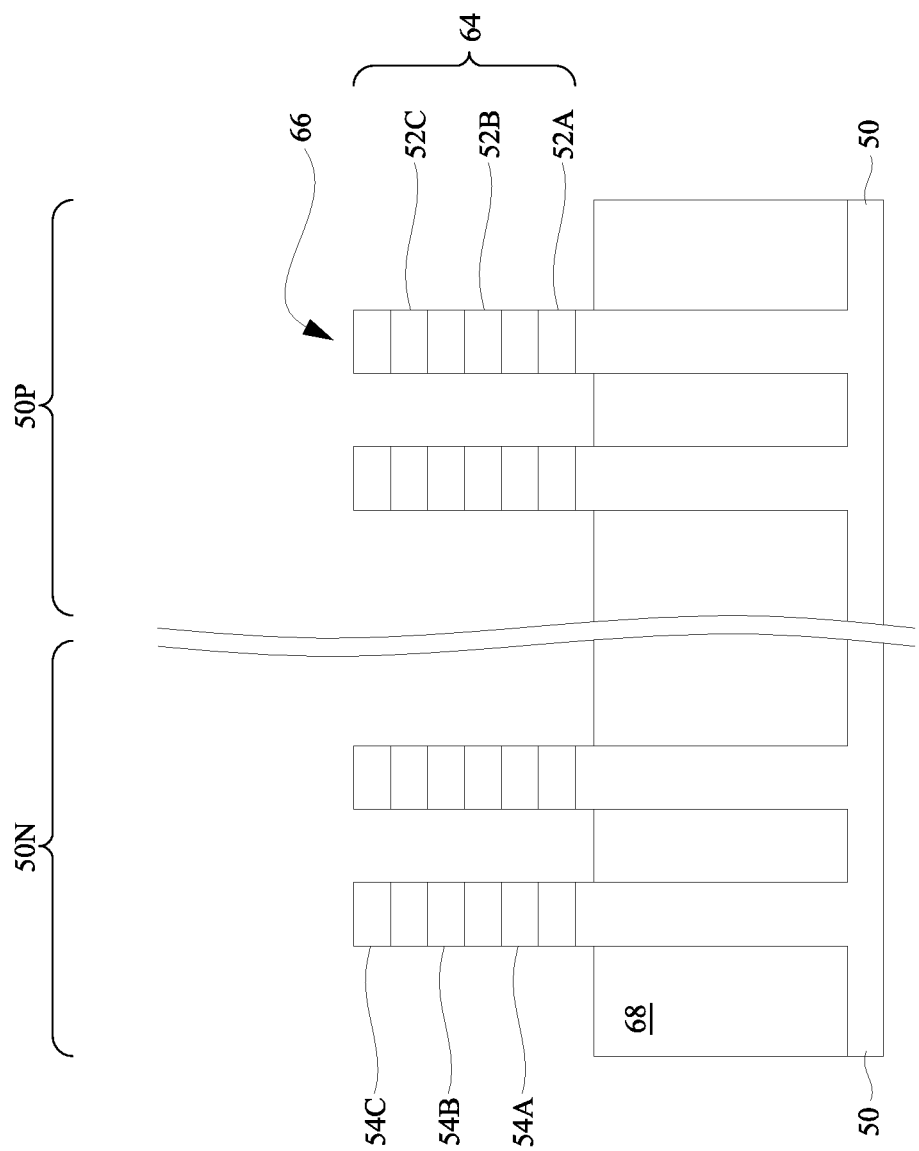

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the regions 50N and the region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
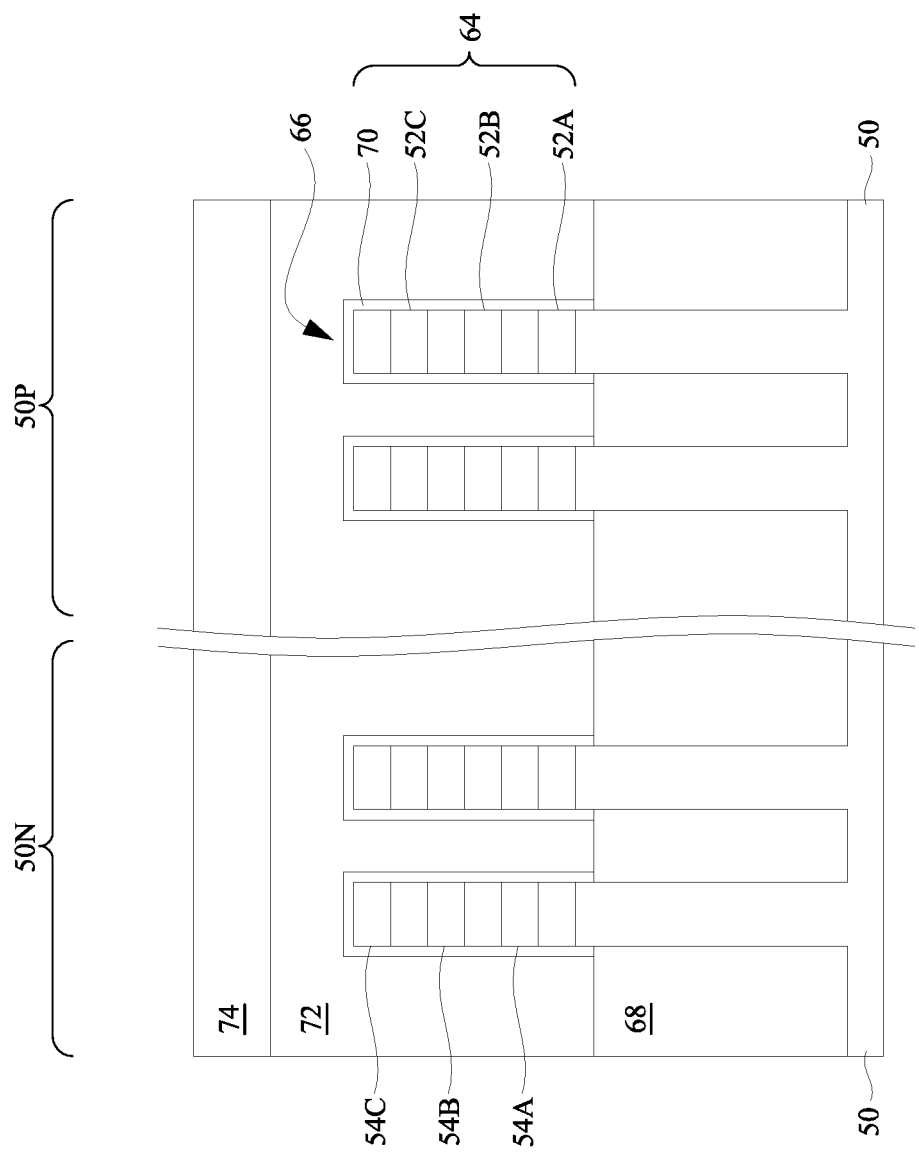

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
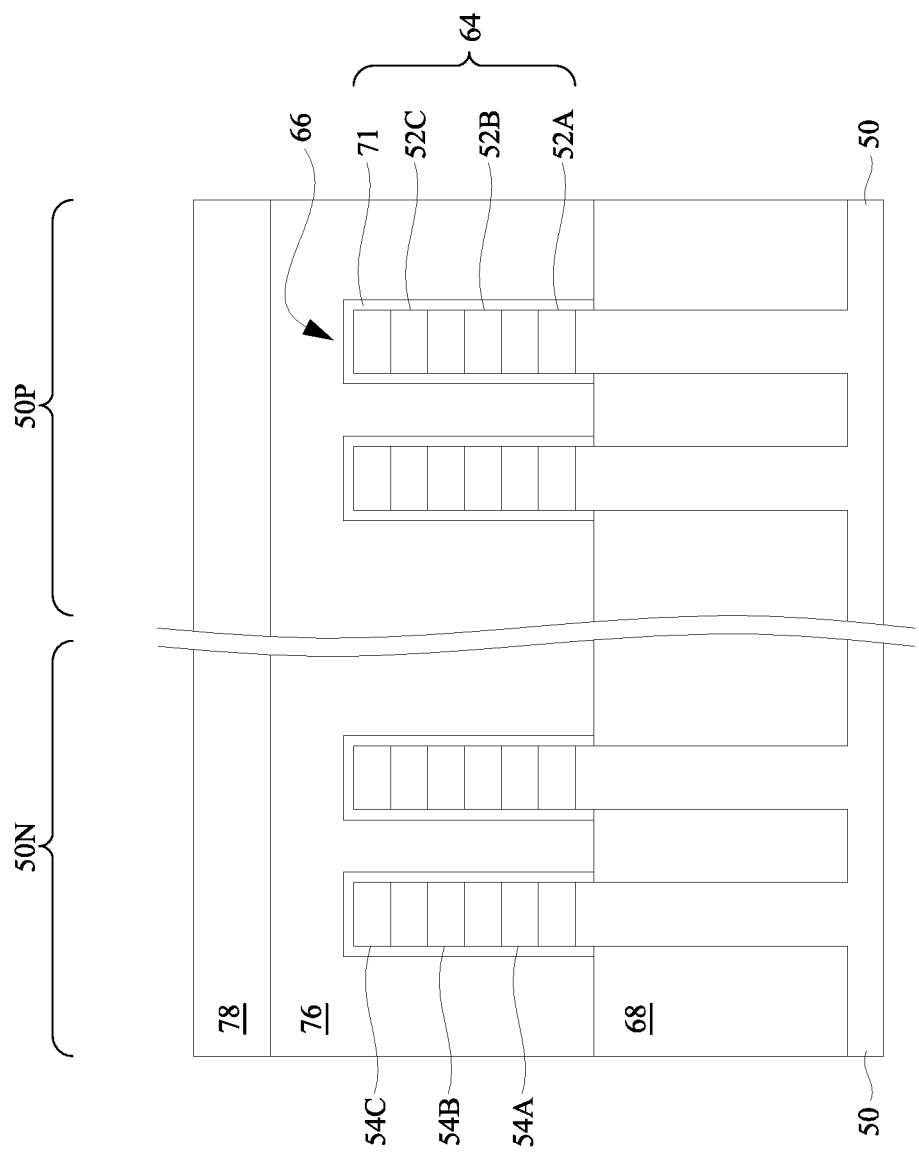
Figure 6B:
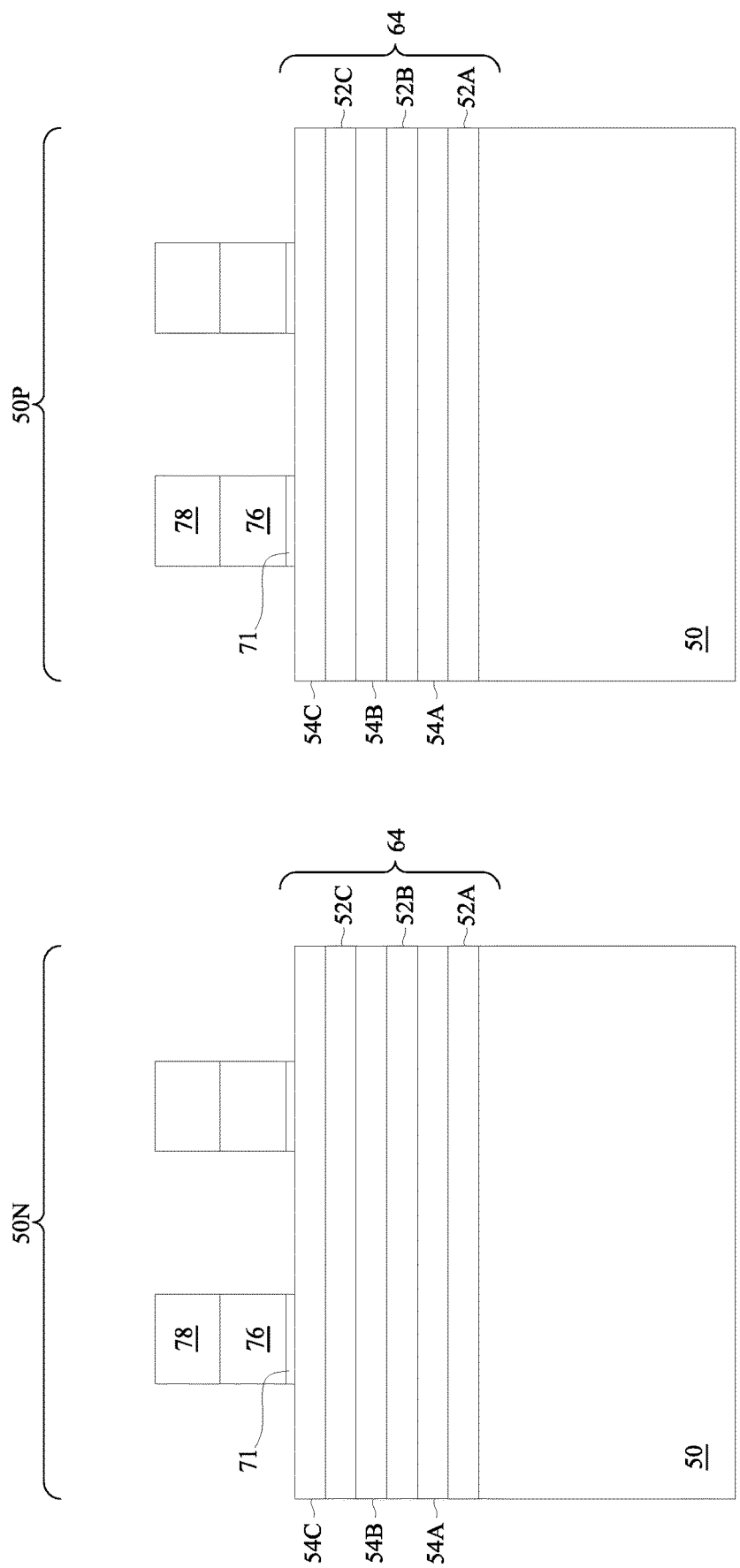

FIGS. 6A through 18C illustrate various additional steps in the manufacturing of embodiment devices. FIGS. 6A, 7A, 8A, 9A, 10A, 11A, 12A, 12C, 13A, 13C, 14A, 15A, and 18C illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
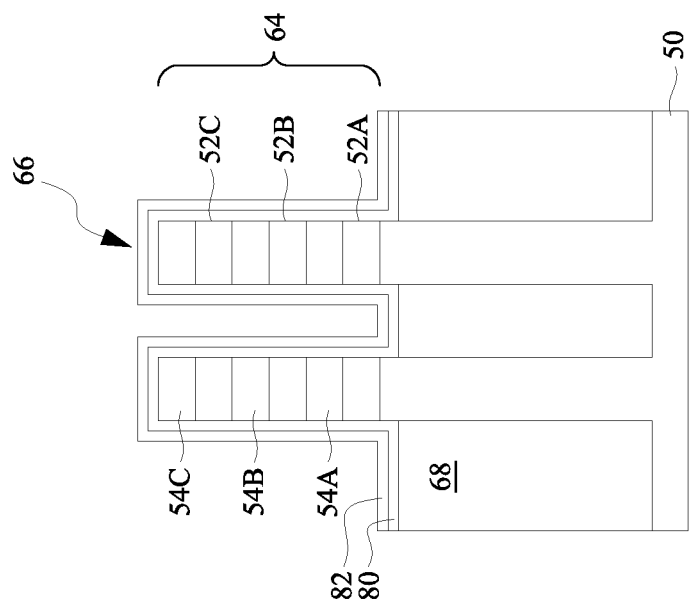

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
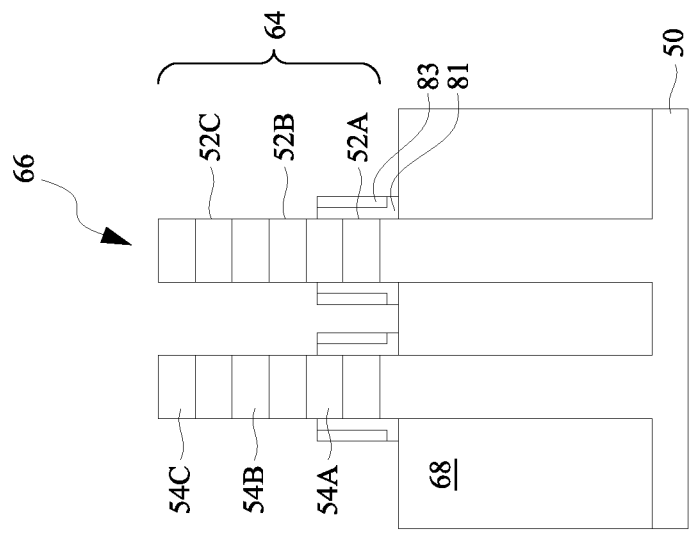

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
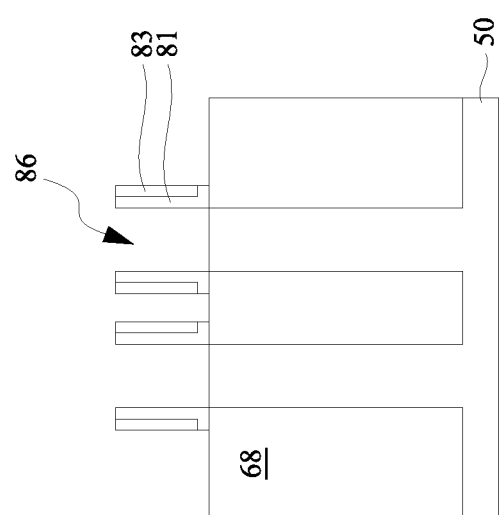
Figure 9B:
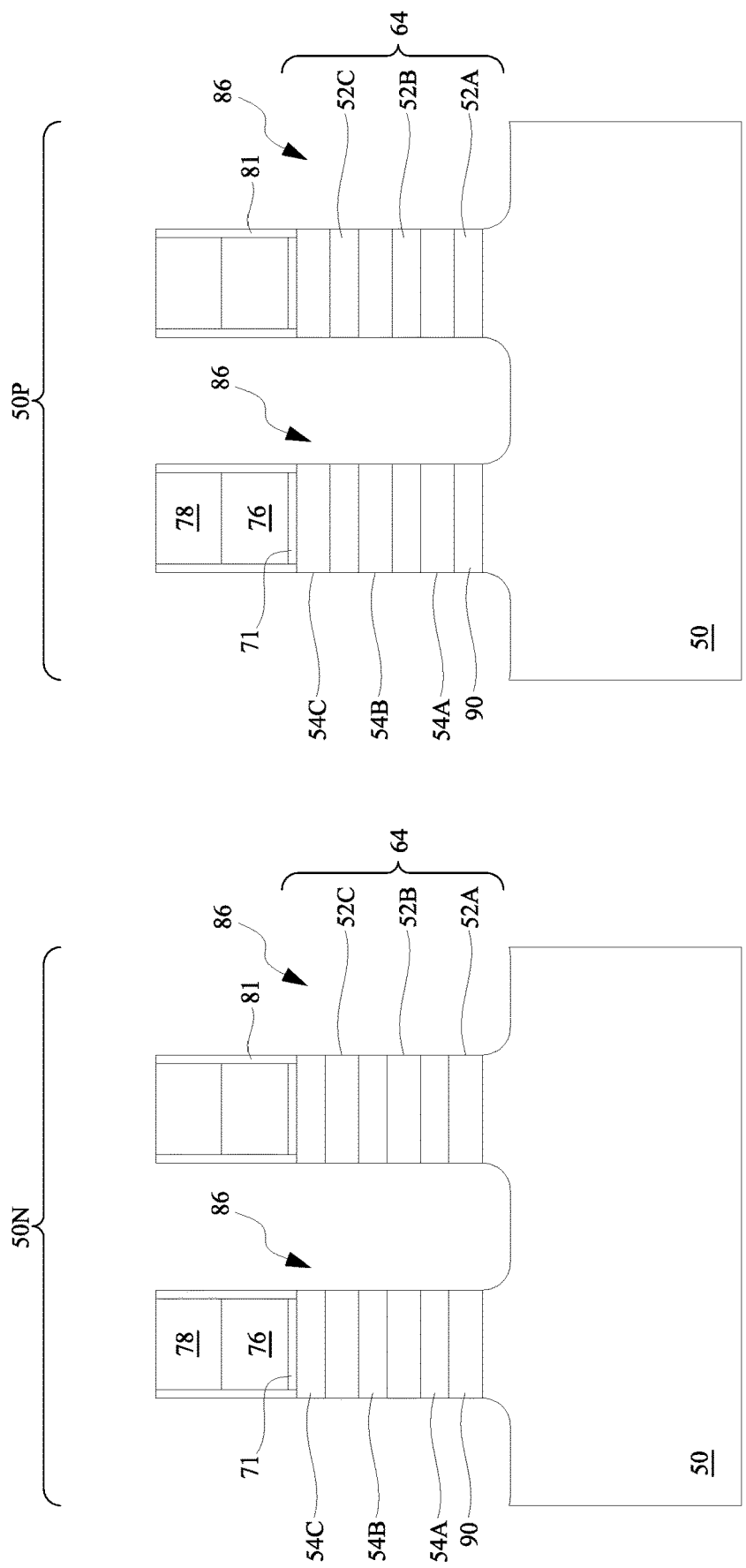

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 58 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
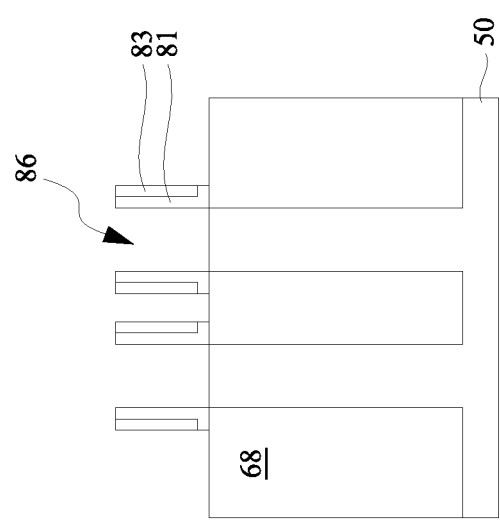
Figure 10B:
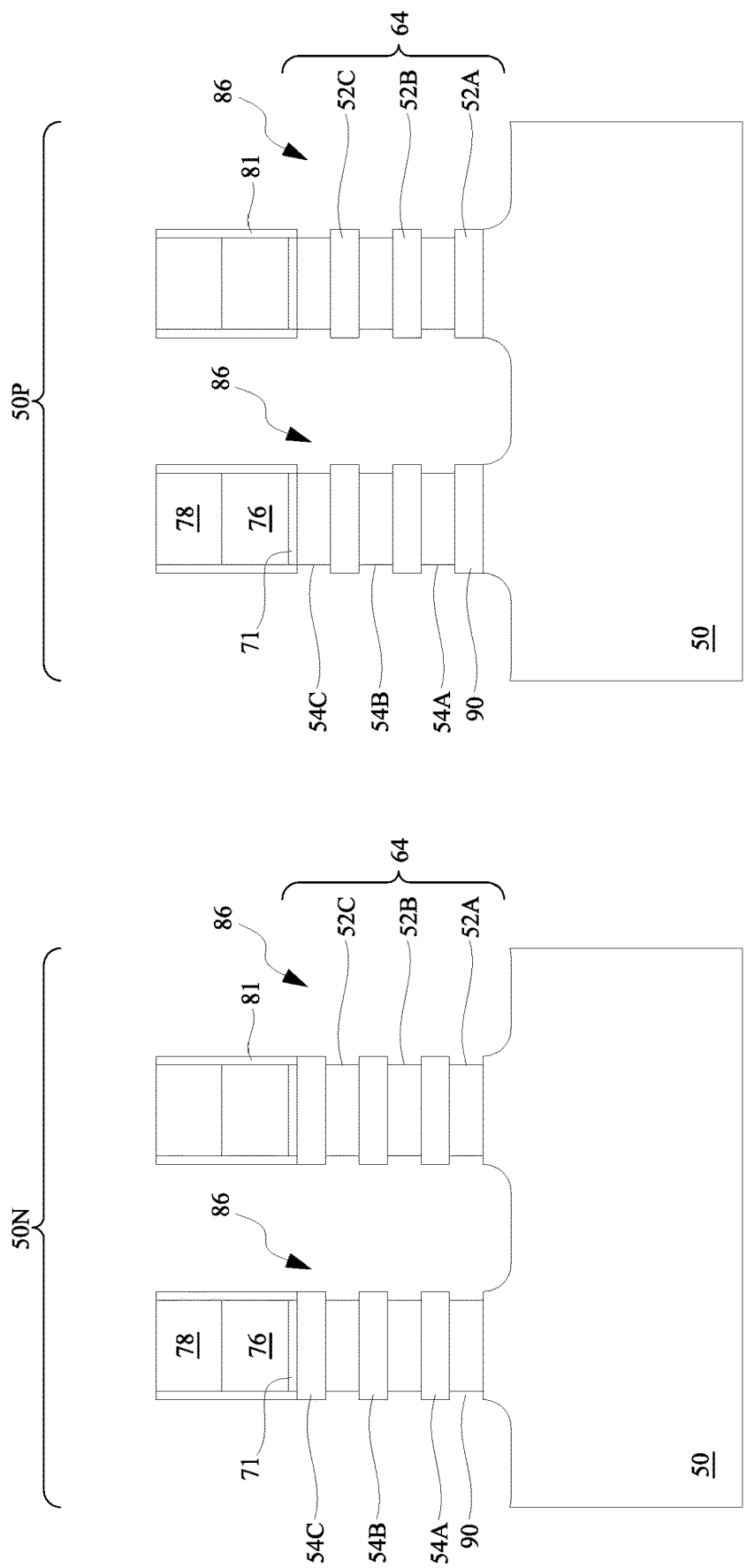

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 56 formed of the second semiconductor materials (e.g., the second nanostructures 54) exposed by the first recesses 86 are etched to form sidewall recesses 88 in the p-type region 50N. Although sidewalls of the first nanostructures 52 and the second nanostructures 54 in recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N, and a dry etch process with hydrogen fluoride, another fluorine-based etchant, or the like may be used to etch sidewalls of the second nanostructures 54 in the p-type region 50P.

Figure 11A:
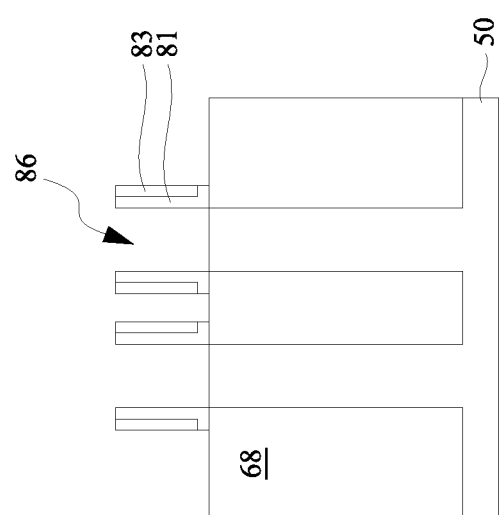
Figure 11B:
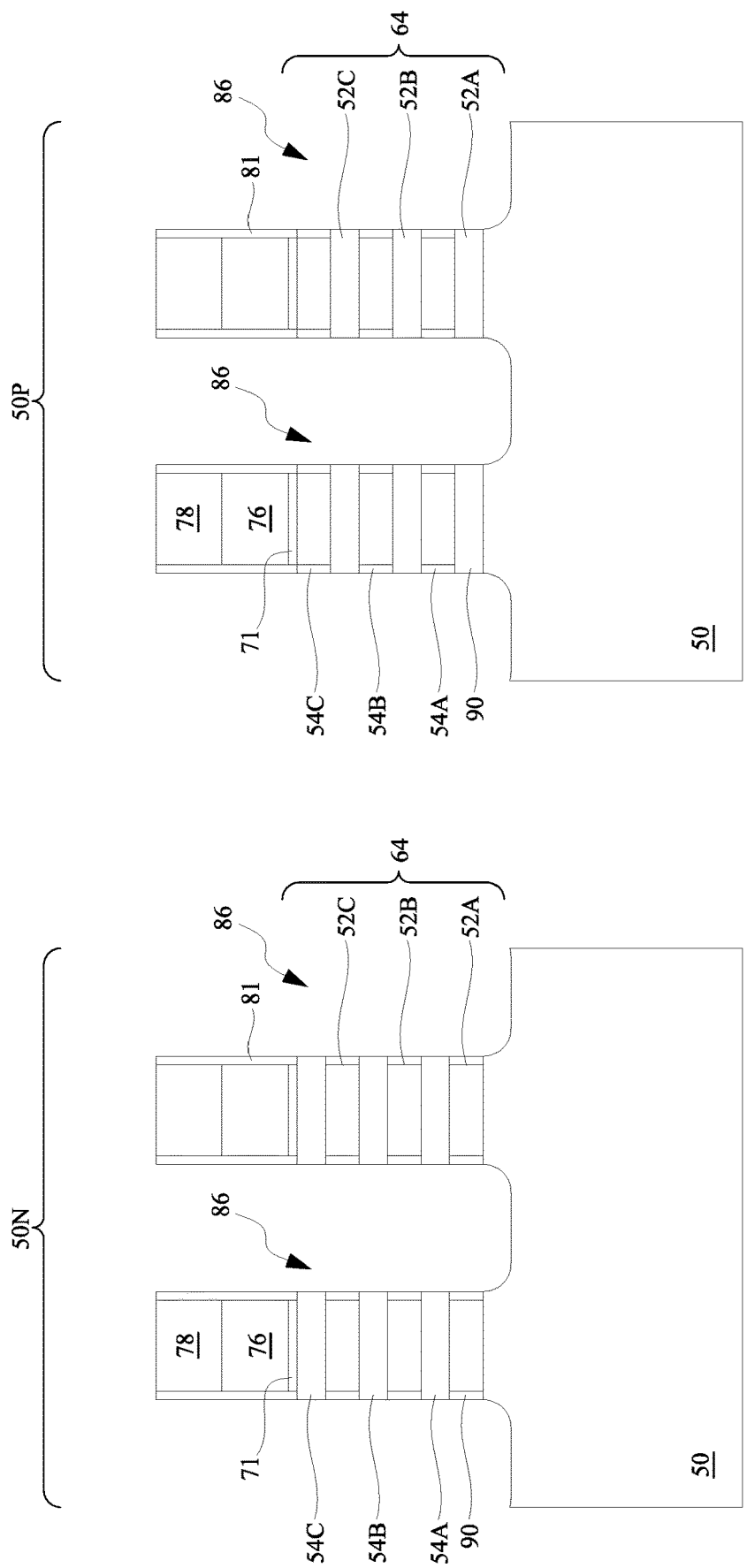
Figure 11C:
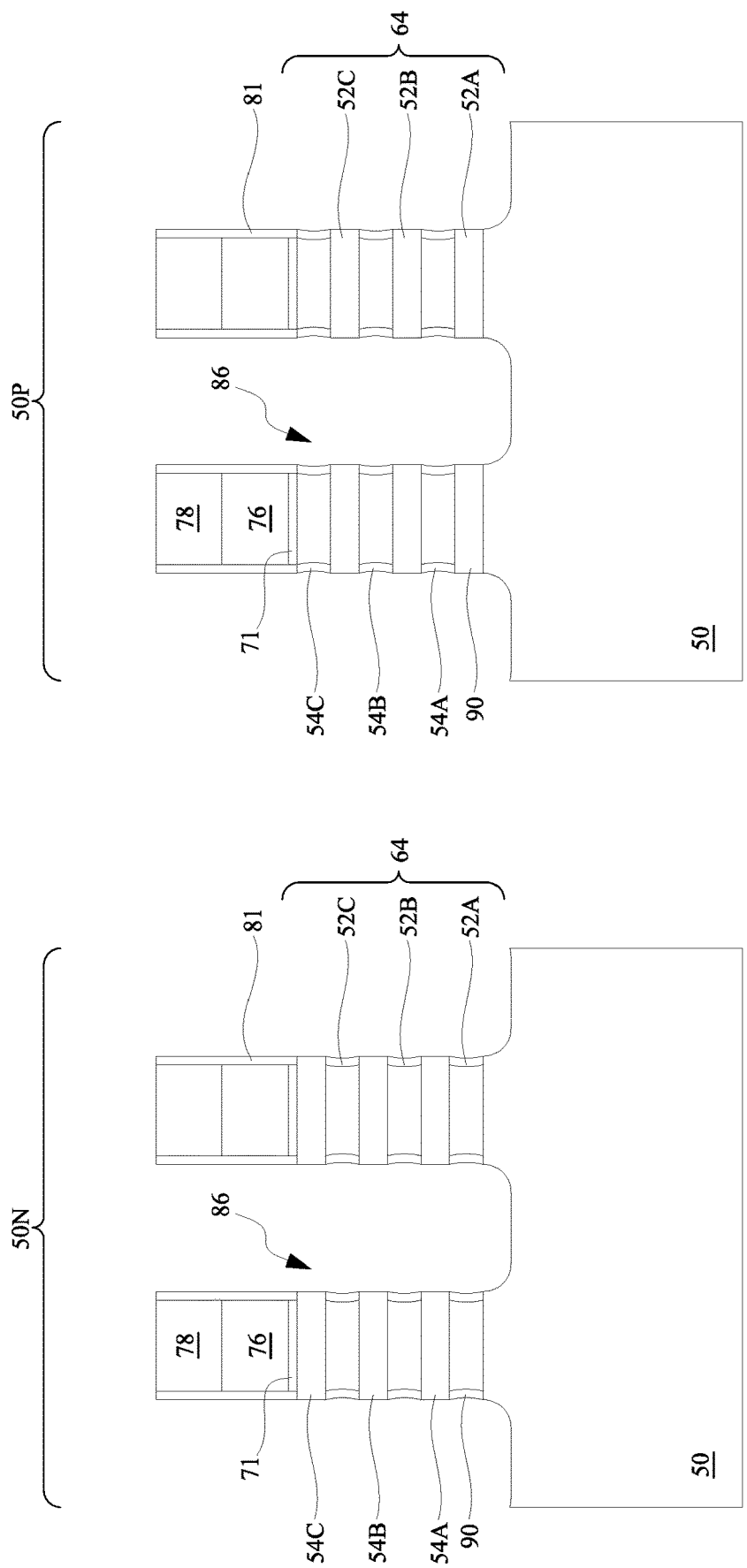

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers are recessed from sidewalls of the second nanostructures 54 in the n-type region 50P. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figure 12A:
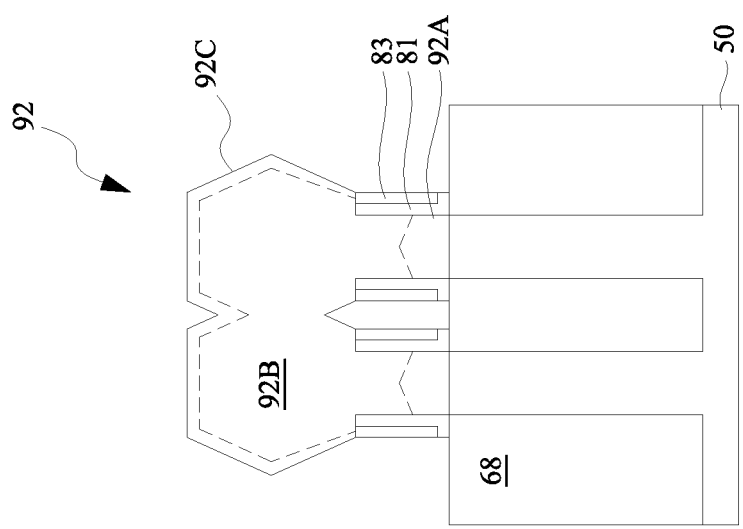
Figure 12B:
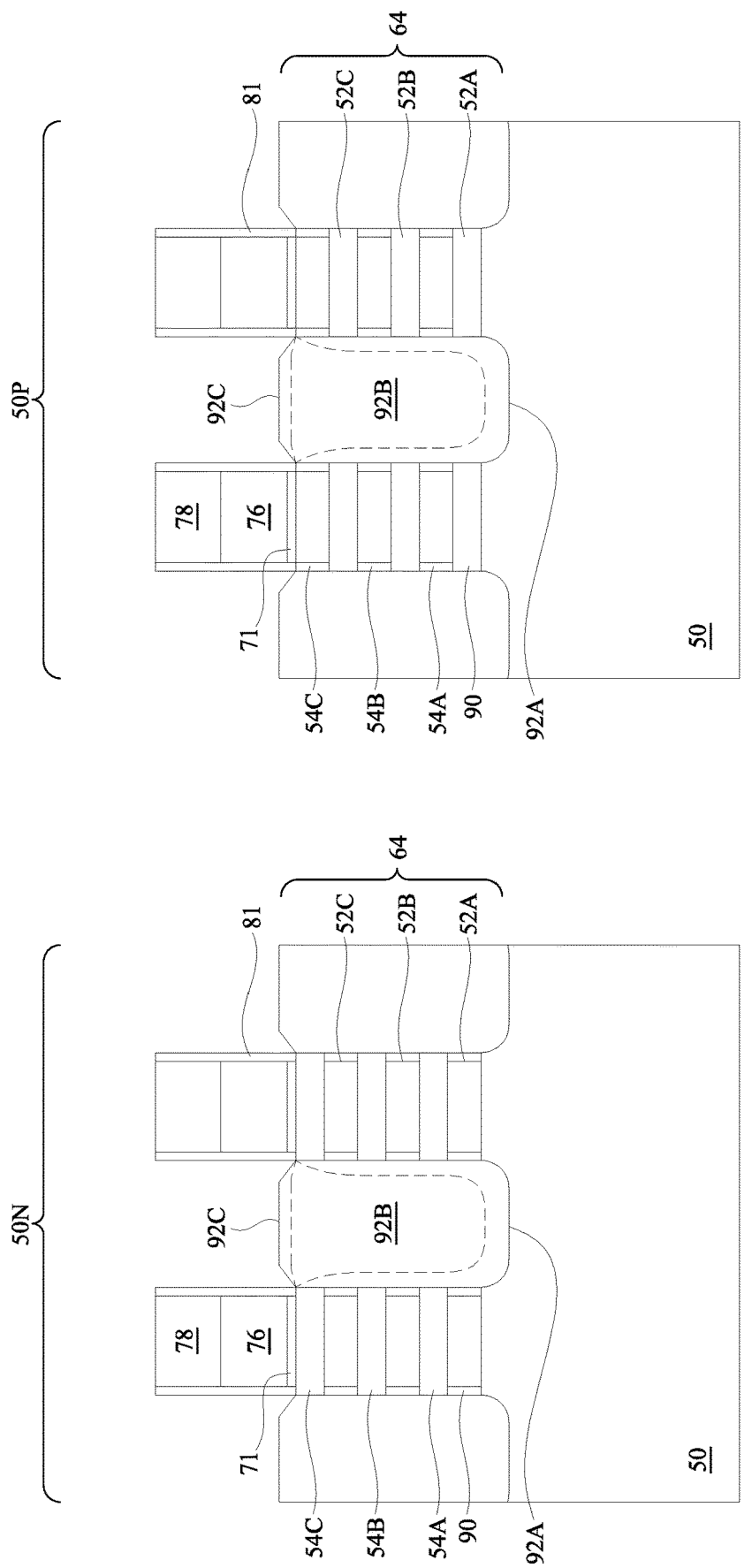
Figure 12C:
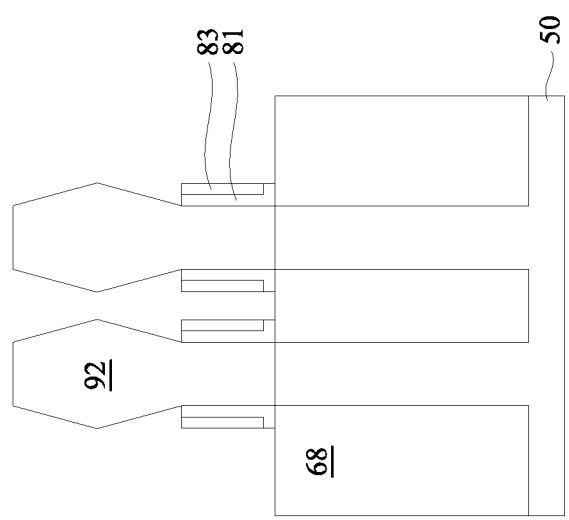

In FIGS. 12A-12C, epitaxial source/drain regions 92 are formed in the first recesses 86. In some embodiments, the source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 72 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
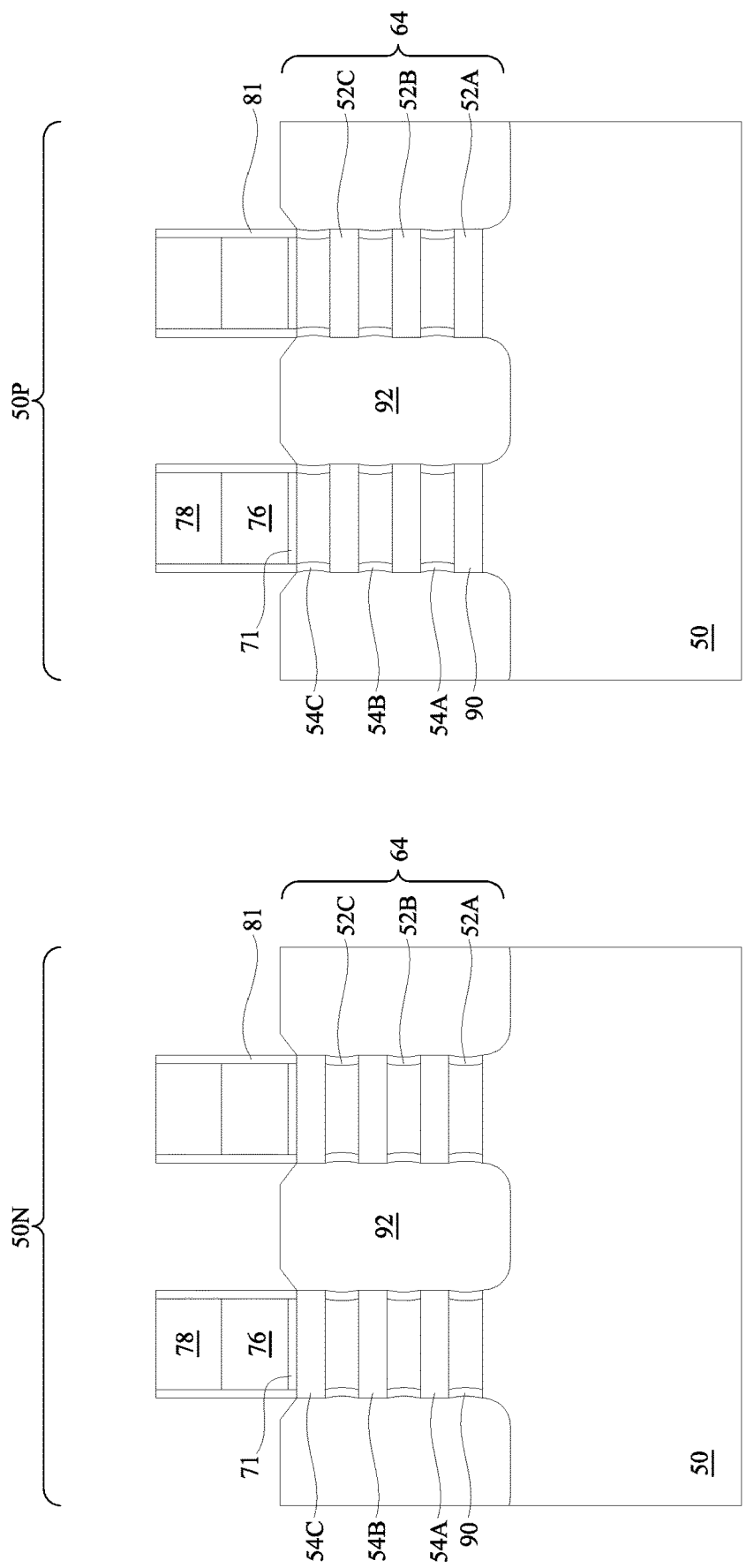

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 13A:
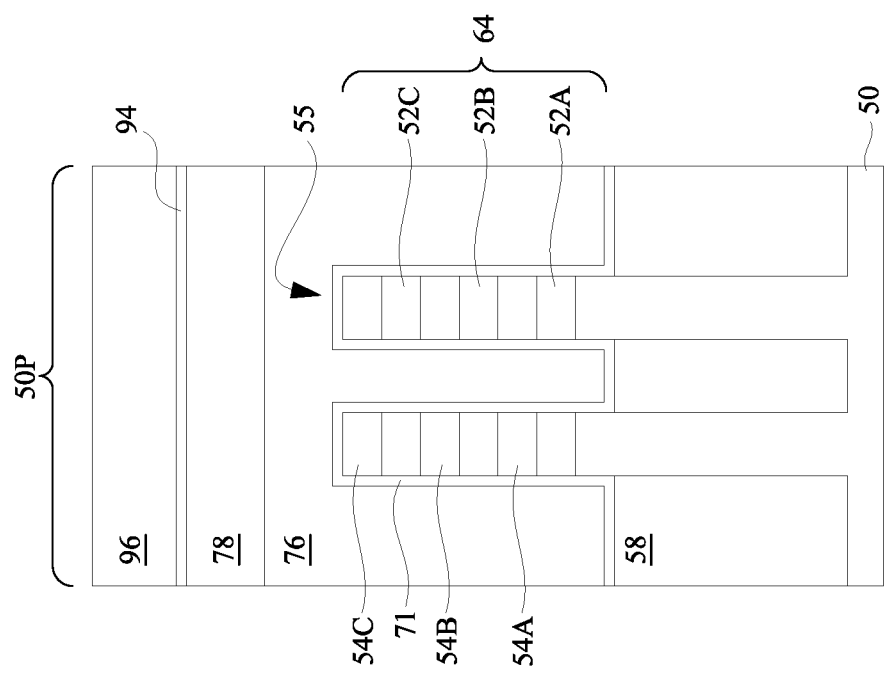
Figure 13C:
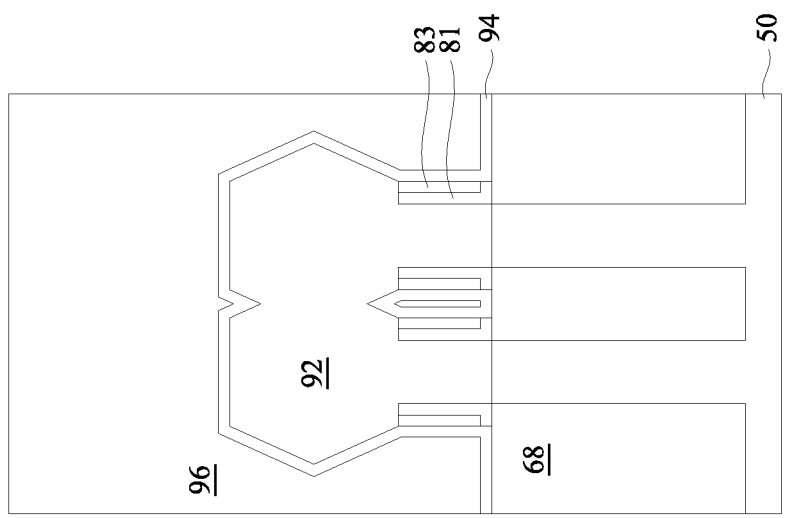

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figure 14A:
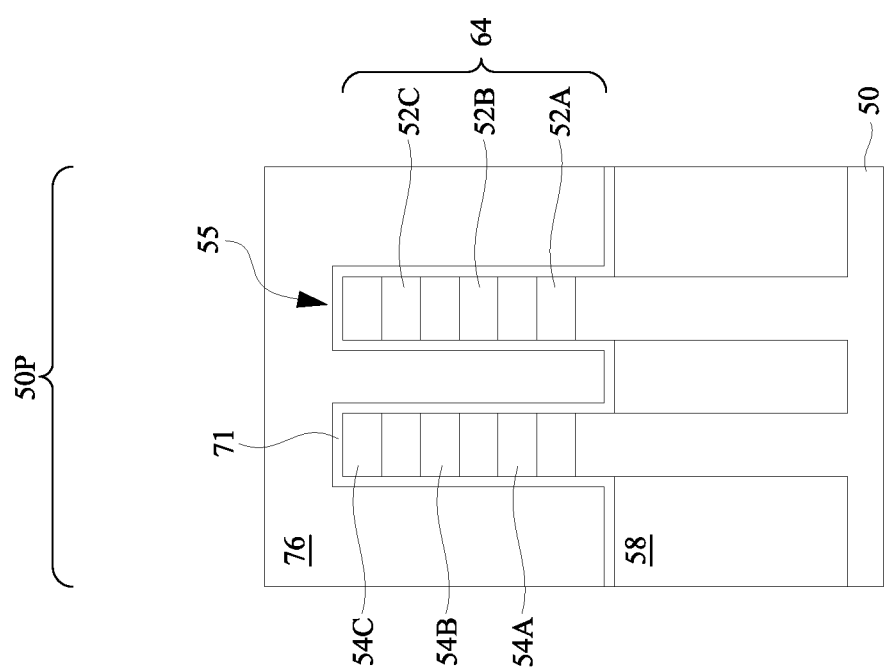
Figure 14B:
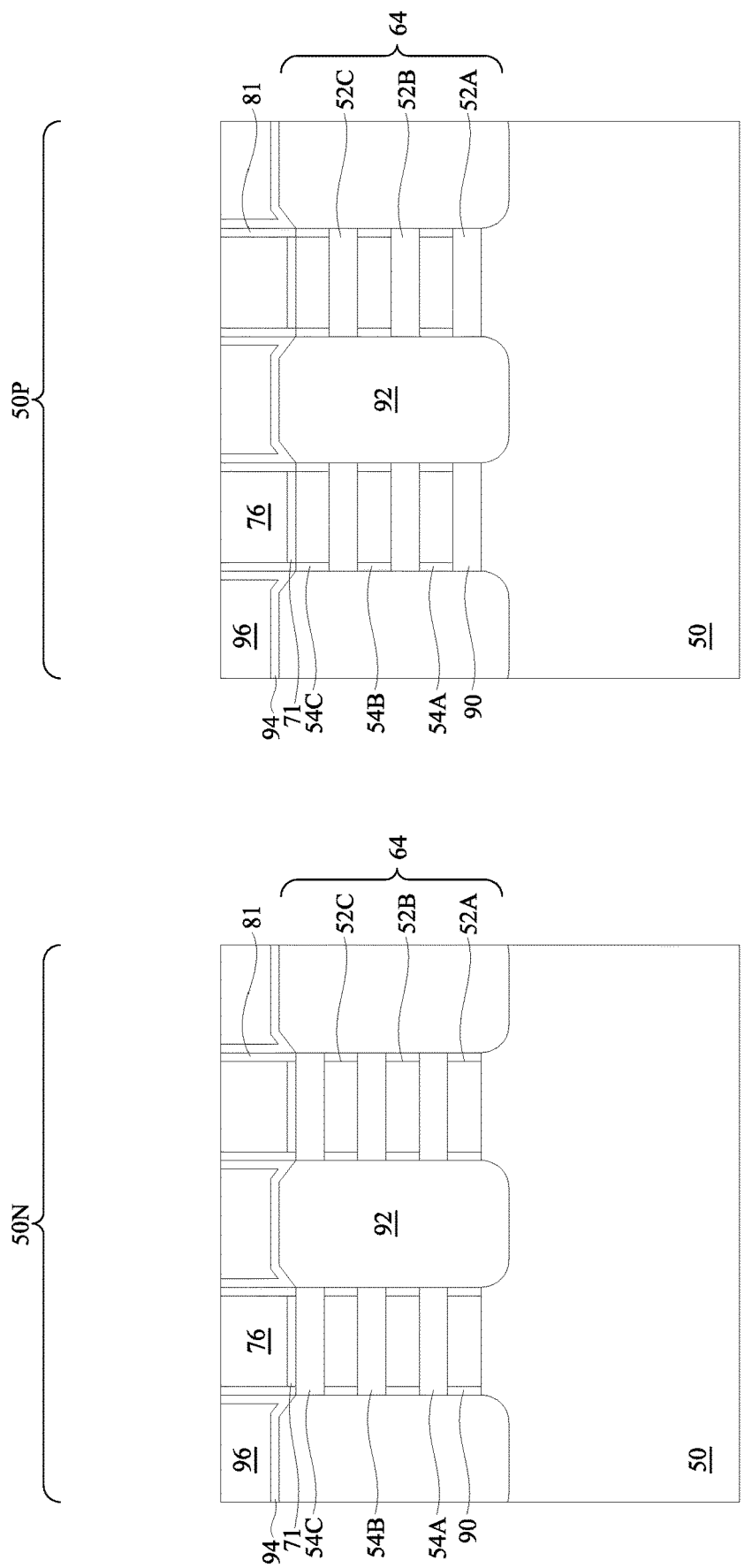

In FIGS. 14A-14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 72 are exposed through the first ILD 96. In some embodiments, the masks 78 may remain, in which case the planarization process levels the top surface of the first ILD 96 with top surface of the masks 78 and the first spacers 81.

Figure 15A:
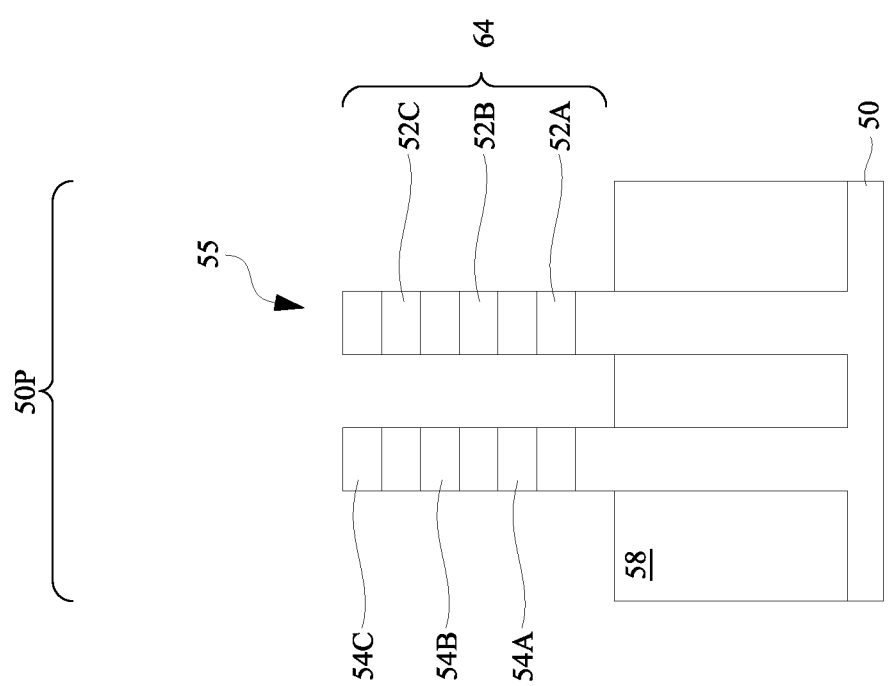
Figure 15B:
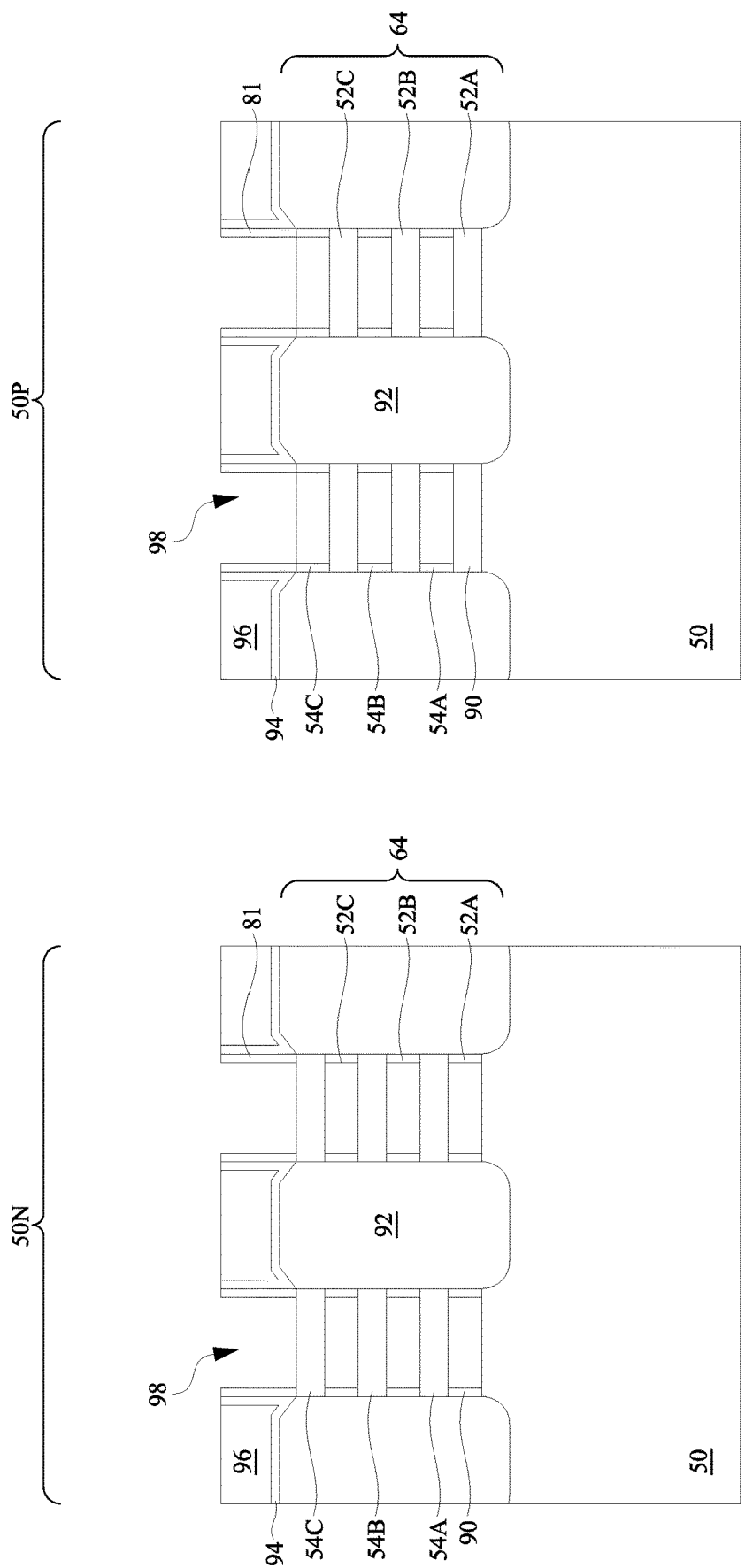

In FIGS. 15A and 15B, the dummy gates 72, and the masks 74 if present, are removed in one or more etching steps, so that second recesses 98 are formed. Portions of the dummy gate dielectrics 60 in the second recesses 98 are also be removed. In some embodiments, the dummy gates 72 and the dummy gate dielectrics 60 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 72 are etched. The dummy dielectric layers 60 may then be removed after the removal of the dummy gates 72.

In FIGS. 16A and 16B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 58 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 58 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In FIGS. 17A and 17B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 94, the first spacers 81, and the STI regions 58.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18C:
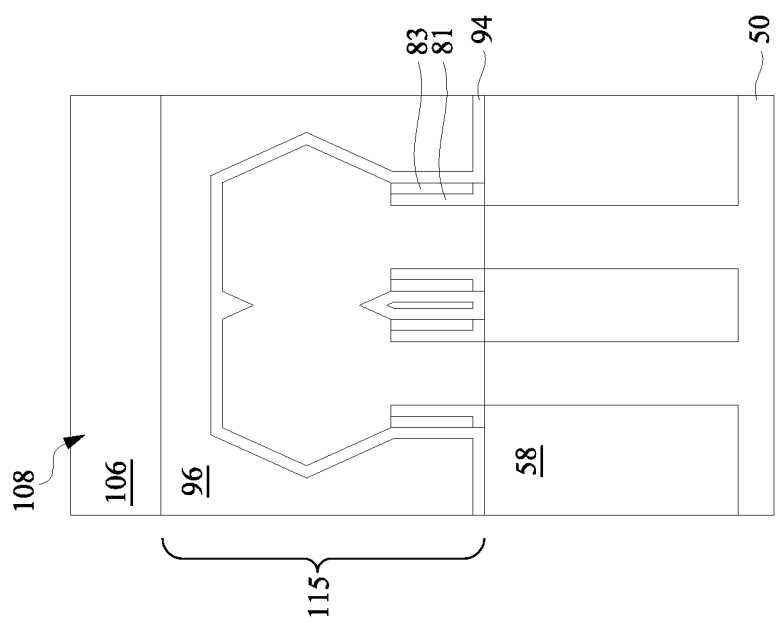

In FIGS. 18A-18C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 23A and 23B) penetrate through the gate mask 104 to contact the top surface of the recessed gate electrodes 102.

As further illustrated by FIGS. 18A-18C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19C:
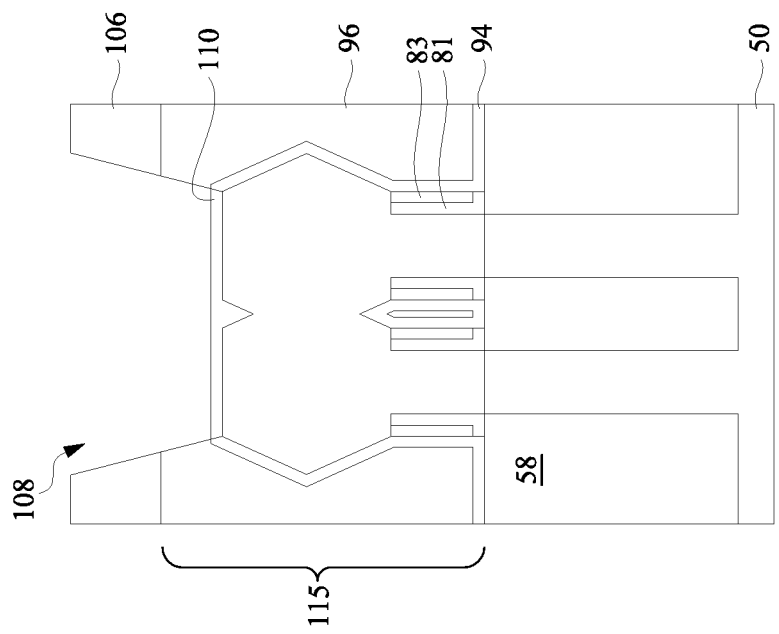

In FIGS. 19A-19C, the second ILD 106, the first ILD 96, the CESL 94, and the gate masks 104 are etched to form third recesses 108 exposing surfaces of the epitaxial source/ drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/ drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 19B illustrate the third recesses 108 as exposing the epitaxial source/drain regions 92 and the gate structure in a same cross section, in various embodiments, the epitaxial source/ drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 20C:
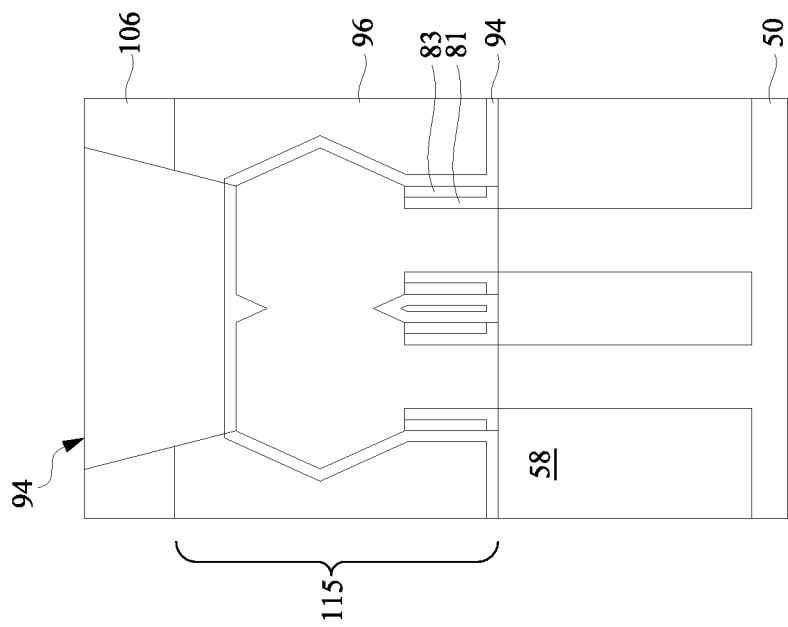

Next, in FIGS. 20A-C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer 114 and a conductive material 118, and is electrically coupled to the underlying conductive feature (e.g., gate structure 102 and/or silicide region 110 in the illustrated embodiment). The contacts 114 are electrically coupled to the gate structure 102 and may be referred to as gate contacts, and the contacts 112 are electrically coupled to the silicide regions 110 and may be referred to as source/drain contacts. The barrier layer 114 may include titanium, titanium nitride, tantalum, tantalum nitride, or the like. The conductive material 118 may be copper, a copper alloy, silver, gold, tungsten, cobalt, aluminum, nickel, or the like. A planarization process, such as a CMP, may be performed to remove excess material from a surface of the second ILD 106.

Although FIGS. 20A-C illustrate a contact 112 extending to each of the epitaxial source/drain regions 92, the contact 112 may be omitted from certain ones of the epitaxial source/drain regions 92. For example, as explained in greater detail below, conductive features (e.g., power rails) may be subsequently attached through a backside of one or more of the epitaxial source/drain regions 92 (e.g., see epitaxial source/drain region 92' of FIGS. 29A-C). For these particular epitaxial source/drain regions 92, the source/drain contacts 112 may be omitted or may be a dummy contact that is not electrically connected to any overlying conductive lines (e.g., conductive lines features, see FIG. 21). Thus, in FIGS. 2 through 20A-C, a device layer 115 of active devices is formed. Although the device layer 115 is described as having nanoFETs, other embodiments may include a device layer 115 having a different type of transistors (e.g., planar FETs, FinFETs, TFTs, or the like).

FIGS. 21 through 29A-C illustrate intermediate steps of forming front-side and back-side interconnect structures on the substrate 50. The front-side and back-side interconnect structures may each comprise conductive features that are electrically connected the nano-FETs formed on the substrate 50. In FIG. 28A, the illustrated cross-section is taken alone line A-A' of FIG. 1. In FIGS. 21 through 28 and 29B, the illustrated cross-sections are taken along line B-B' of FIG. 1. In FIG. 28C, the illustrated cross-section is taken alone line C-C' of FIG. 1. The process steps described in FIGS. 21 through 29 may be applied to both the n-type region 50N and the p-type region 50P. For ease of illustration, the n-type region 50 is illustrated. Further, as noted above, a back-side conductive feature (e.g., a power rail) may be connected to one or more of the epitaxial source/ drain regions 92 (e.g., epitaxial source/drain regions 92' in FIGS. 21 through 29). As such, front-side, contacts 112 may be optionally omitted from the epitaxial source/drain regions 92'.

Figure 21:
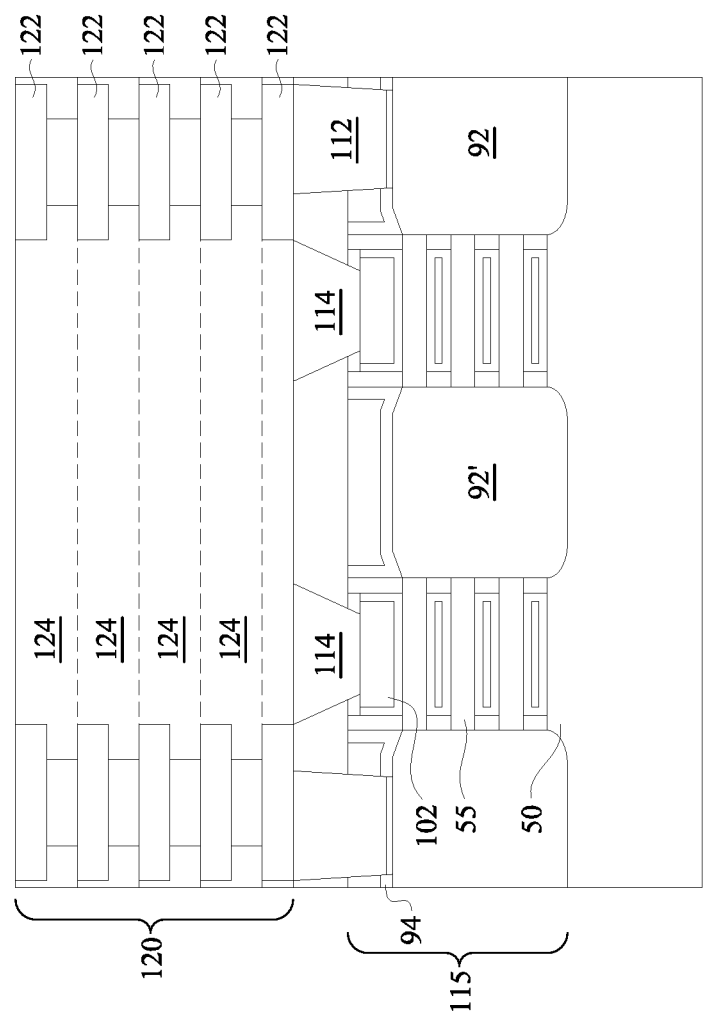

In FIG. 21, an interconnect structure 120 is formed on the second ILD 106. The interconnect structure 120 may also be referred to as a front-side interconnect structure because it is formed on a front-side of the substrate 50/the device layer 115 (e.g., a side of the substrate 50 on which the device layer 115 is formed).

The interconnect structure 120 may comprise one or more layers of conductive features 122 formed in one or more stacked dielectric layers 124. Each of the stacked dielectric layers 124 may comprise a dielectric material, such as a low-k dielectric material, an extra low-k (ELK) dielectric material, or the like. The dielectric layers 124 may be deposited using an appropriate process, such as, CVD, ALD, PVD, PECVD, or the like.

Conductive features 122 may comprise conductive lines and conductive vias interconnecting the layers of conductive lines. The conductive vias may extend through respective ones of the dielectric layers 124 to provide vertical connections between layers of conductive lines. The conductive features 122 may be formed through any acceptable process, such as, a damascene process, a dual damascene process, or the like.

For example, the conductive features 122 may be formed using a damascene process in which a respective dielectric layer 122 is patterned utilizing a combination of photolithography and etching techniques to form trenches corresponding to the desired pattern of the conductive features 122. An optional diffusion barrier and/or optional adhesion layer may be deposited and the trenches may then be filled with a conductive material. Suitable materials for the barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the conductive features 122 may be formed by depositing a seed layer of copper or a copper alloy, and filling the trenches by electroplating. A chemical mechanical planarization (CMP) process or the like may be used to remove excess conductive material from a surface of the respective dielectric layer 122 and to planarize the surface for subsequent processing.

In FIG. 21, five layers of conductive features 122 and dielectric layers 124 are illustrated. However, it should be appreciated that the interconnect structure 120 may comprise any number of conductive features disposed in any number of dielectric layers. Interconnect structure 120 may be electrically connected to gate contacts 114 and source/drain contacts 112 to form functional circuits. In some embodiments, the functional circuits formed by the interconnect structure 120 may comprise logic circuits, memory circuits, image sensor circuits, or the like.

Figure 22:
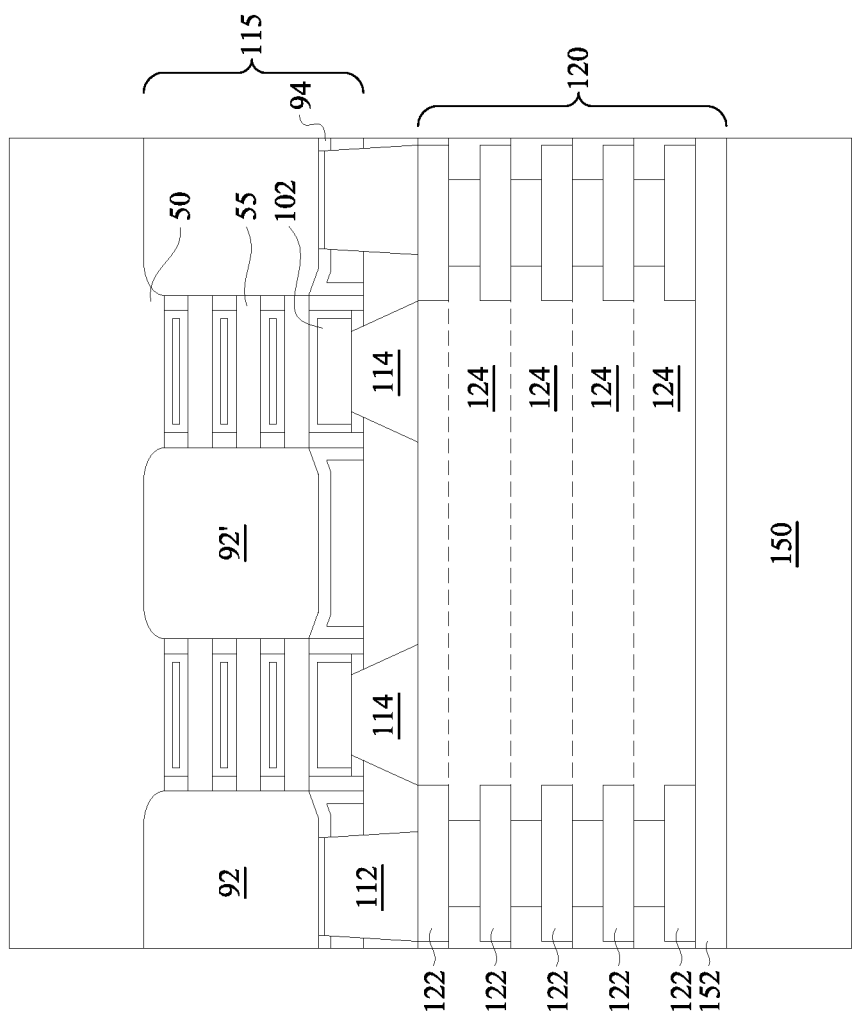

Next in FIG. 22, a carrier substrate 150 is bonded to a top surface of the interconnect structure 120 by bonding layers 152A-B (collectively referred to as bonding layer 152). The carrier substrate 150 may be a glass carrier substrate, a ceramic carrier substrate, a semiconductor substrate (e.g., a silicon substrate), a wafer (e.g., a silicon wafer), or the like. The carrier substrate 150 may provide structural support during subsequent processing steps and in the completed device. The carrier substrate 150 be substantially free of any active or passive devices.

In various embodiments, the carrier substrate 150 may be bonded to the interconnect structure 120 using a suitable technique such as dielectric-to-dielectric bonding, or the like. Dielectric-to-dielectric bonding may comprise depositing the bonding layer 152A on the interconnect structure 120. In some embodiments, the bonding layer 152A comprises silicon oxide (e.g., a high density plasma (HDP) oxide, or the like) that is deposited by CVD, ALD, PVD, or the like. The bonding layer 152B may likewise be an oxide layer that is formed on a surface of the carrier substrate 150 prior to bonding using, for example, CVD, ALD, PVD, thermal oxidation, or the like. Other suitable materials may be used as well for the bonding layers 152A and 152B.

The dielectric-to-dielectric bonding process may further include applying a surface treatment to one or more of the bonding layers 152. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the bonding layers 152. The carrier substrate 150 is then aligned with the interconnect structure 120 and the two are pressed against each other to initiate a pre-bonding of the carrier substrate 150 to the interconnect structure 120. The pre-bonding may be performed at room temperature (between about 21 degrees and about 25 degrees). After the pre-bonding, an annealing process may be applied by for example, heating the interconnect structure 120 and the carrier substrate 150 to a temperature of about 170 degrees.

As further illustrated by FIG. 22, after the carrier substrate 150 is bonded to the interconnect structure 120, the device may be flipped such that a backside of the substrate 50 faces upwards. The backside of the substrate 50 may refer to a side opposite to the front-side of the substrate 50 on which the device layer 115 is formed.

Figure 23:
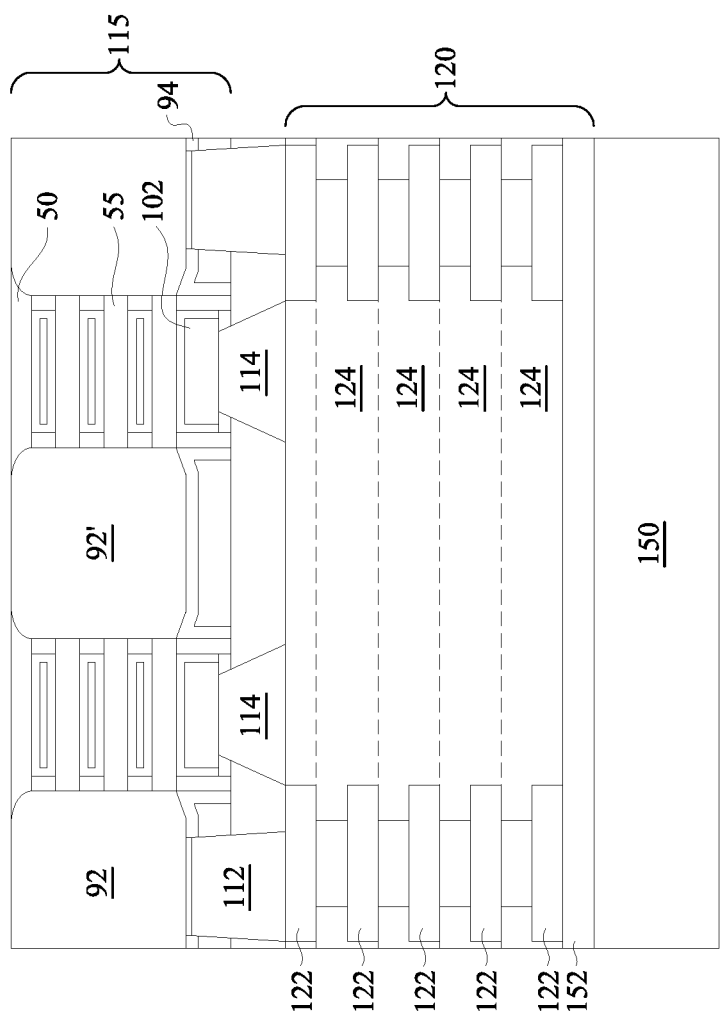

Next, in FIG. 23, a thinning process may be applied to the backside of the substrate 50. The thinning process may comprise a planarization process (e.g., mechanical grinding, chemical mechanical polish (CMP), or the like), an etch back process, combinations thereof, or the like. The thinning process may expose a surface of the epitaxial source/drain regions 92 opposite the interconnect structure 120. Further, a portion of the substrate 50 may remain over the gate structure (e.g., gate electrodes 102 and the gate dielectric layers 100) and the nanostructures 55 after the thinning process.

Figure 24:
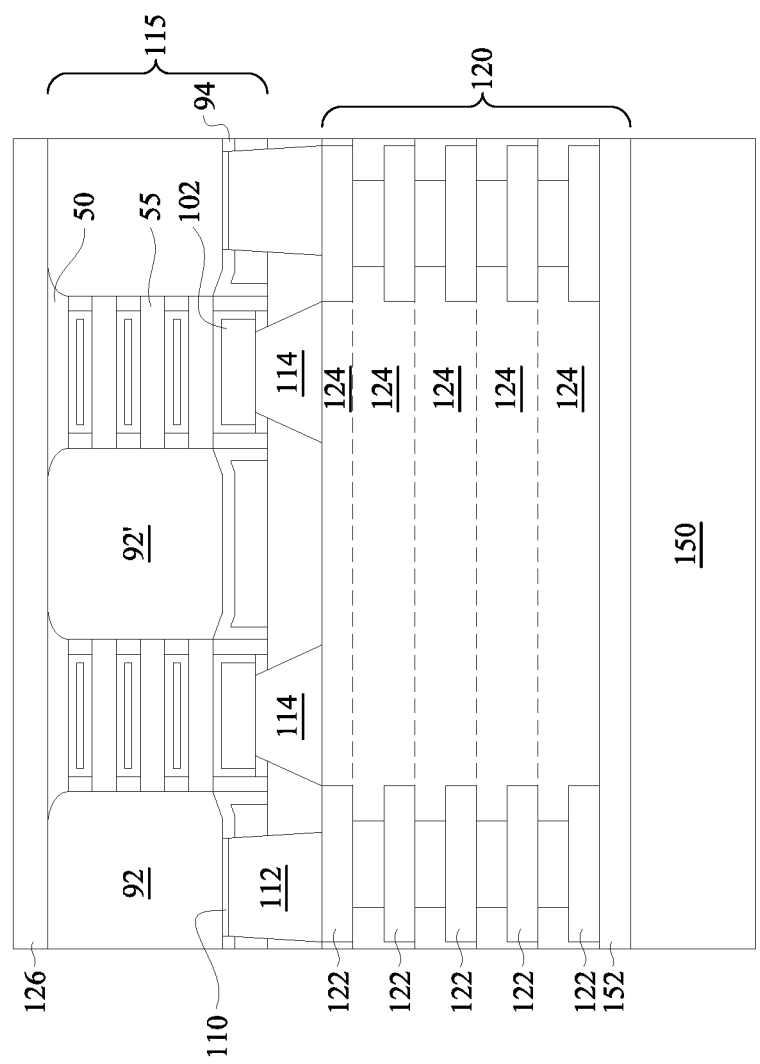

In FIG. 24, a dielectric layer 126 is deposited on the backside of the device. The dielectric layer 126 may be deposited over the epitaxial source/drain regions 92 and remaining portions of the substrate 50. The dielectric layer 126 may physically contact surfaces of the epitaxial source/drain regions 92 and the remaining portions of the substrate 50. The dielectric layer 126 may be substantially similar to the second ILD 106 described above. For example, the dielectric layer 126 may be formed of a like material and using a like process as the second ILD 106.

Figure 25:
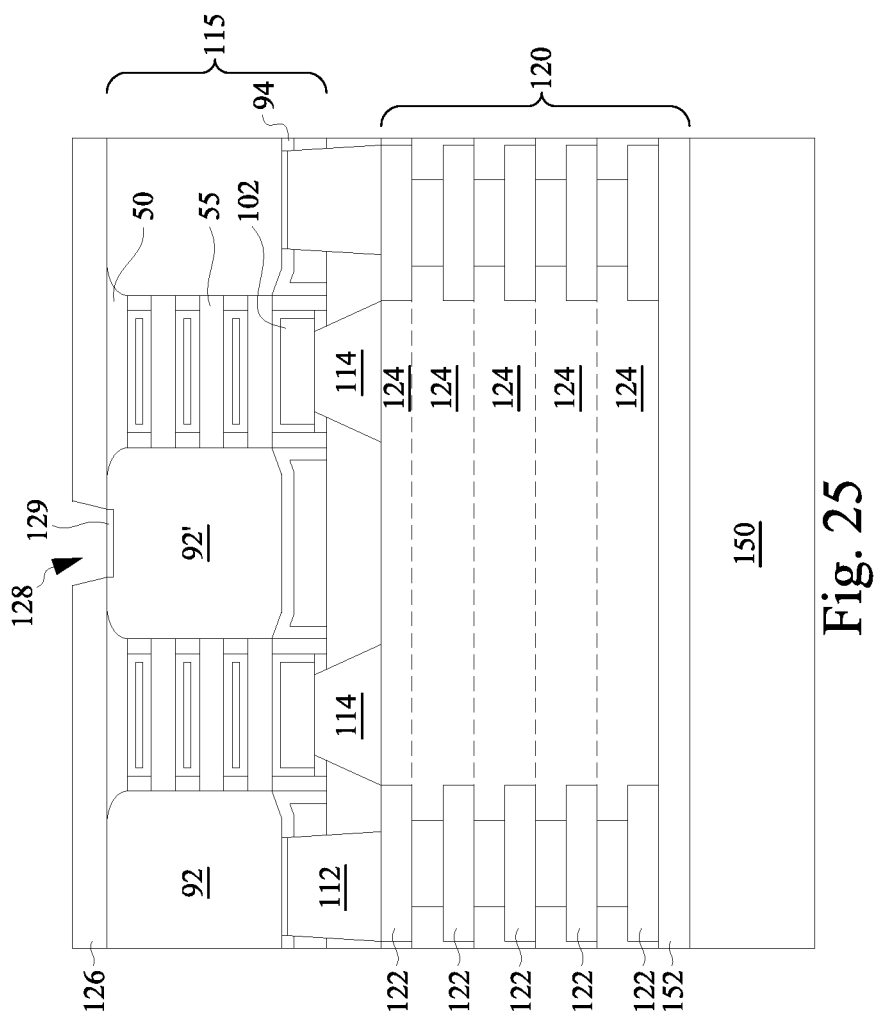

In FIG. 25, fourth recesses 128 are patterned in the dielectric layer 126. The fourth recesses 128 may be patterned using a like process as described above with respect to the third recesses 108 in FIGS. 19A-C. The fourth recesses 128 may expose surfaces of the epitaxial source/drain regions 92'. As also illustrated in FIG. 25, silicide regions 129 are formed on a backside of the epitaxial source/drain regions 92'. The silicide regions 129 may be similar to the silicide regions 110 described above. For example, the silicide regions 129 may be formed of a like material and using a like process as the silicide regions 110.

Figure 26:
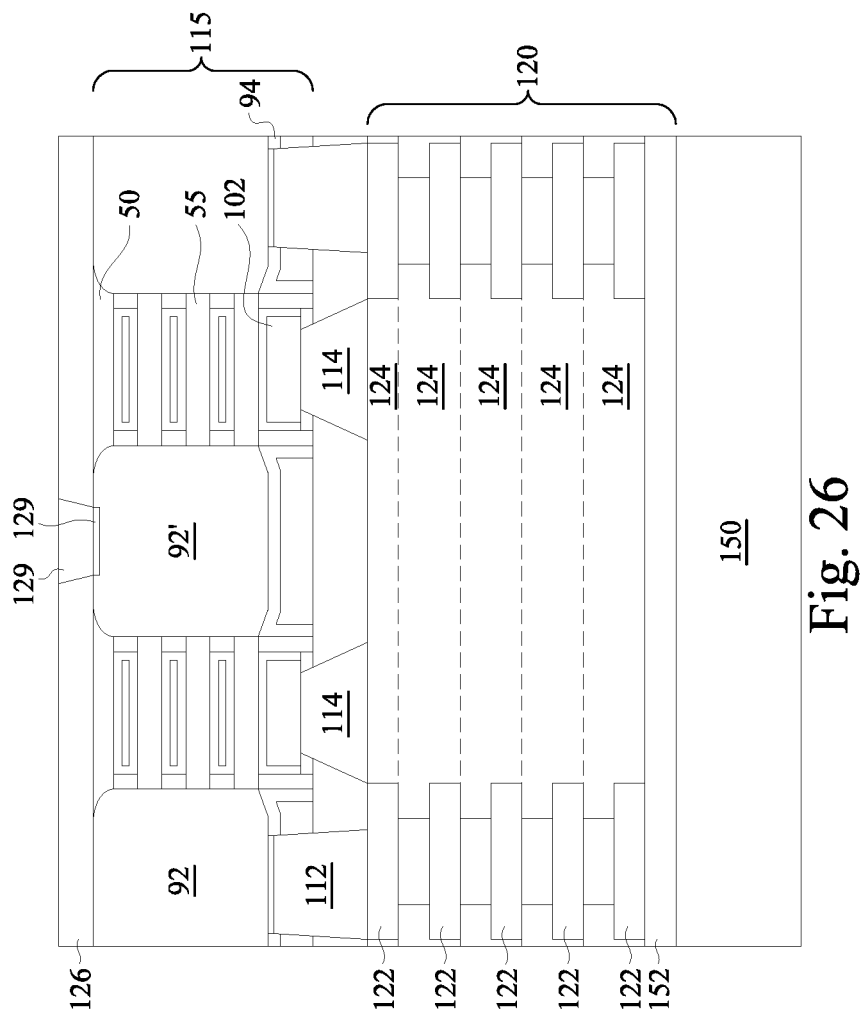

In FIG. 26, contacts 130 are formed in the fourth recesses 128. The contacts 130 may extend through the dielectric layer 126 to extend to and electrically contact the epitaxial source/drain regions 92' through the silicide regions 129. The contacts 130 may be similar to the contacts 112 described above. For example, the contacts 130 may be formed of a like material and using a like process as the contacts 112.

Figure 27:
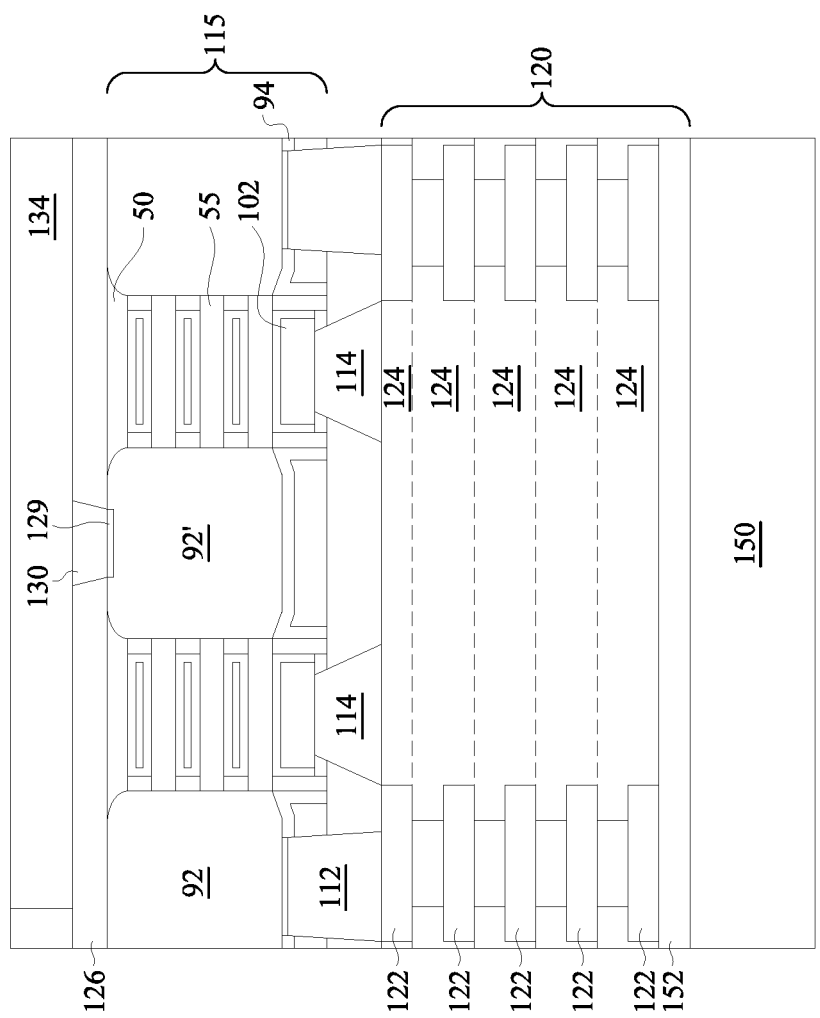

In FIG. 27, conductive lines 134 and a dielectric layer 132 are formed over the dielectric layer 126 and the contacts 130. The dielectric layer 132 may be similar to the dielectric layer 126. For example, dielectric layer 132 may be formed of a like material and using a like process as the dielectric layer 126.

The conductive lines 134 are formed in the dielectric layer 132. Forming the conductive lines 134 may include patterning recesses in the dielectric layer 132 using a combination of photolithography and etching processes, for example. A pattern of the recesses in the dielectric layer 132 may correspond to a pattern of the conductive lines 134. The conductive lines 134 are then formed by depositing a conductive material in the recesses. In some embodiments, power rail 134 comprises a metal layer, which may be a single layer or a composite layer comprising a plurality of sub-layers formed of different materials. In some embodiments, the power rail 134 comprises copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer includes titanium, titanium nitride, titanium oxide, tantalum, tantalum nitride, titanium oxide, or the like. The conductive lines 134 may be formed using, for example, CVD, ALD, PVD, plating or the like. The conductive lines 134 is physically and electrically coupled to the epitaxial source/drain regions 92' through the contacts 130 and the silicide regions 129. A planarization process (e.g., CMP, grinding, etch back, or the like) may be performed to remove excess portions of the conductive lines 134 formed over the dielectric layer 132.

In some embodiments, the conductive lines 134 are power rails, which are conductive lines that electrically connect the epitaxial source/drain regions 92' to a reference voltage, supply voltage, or the like. By placing power rails on a backside of the resulting semiconductor die rather than in a front-side of the semiconductor die, advantages may be achieved. For example, a gate density of the nano-FETs and/or interconnect density of the interconnect structure 120 may be increased. Further, the backside of the semiconductor die may accommodate wider power rails, reducing resistance and increasing efficiency of power delivery to the nano-FETs. For example, a width of the conductive lines 134 may be at least twice a width of a first level conductive line (e.g., conductive line 122A in FIG. 27) of the front-side interconnect structure 120.

Figure 28:
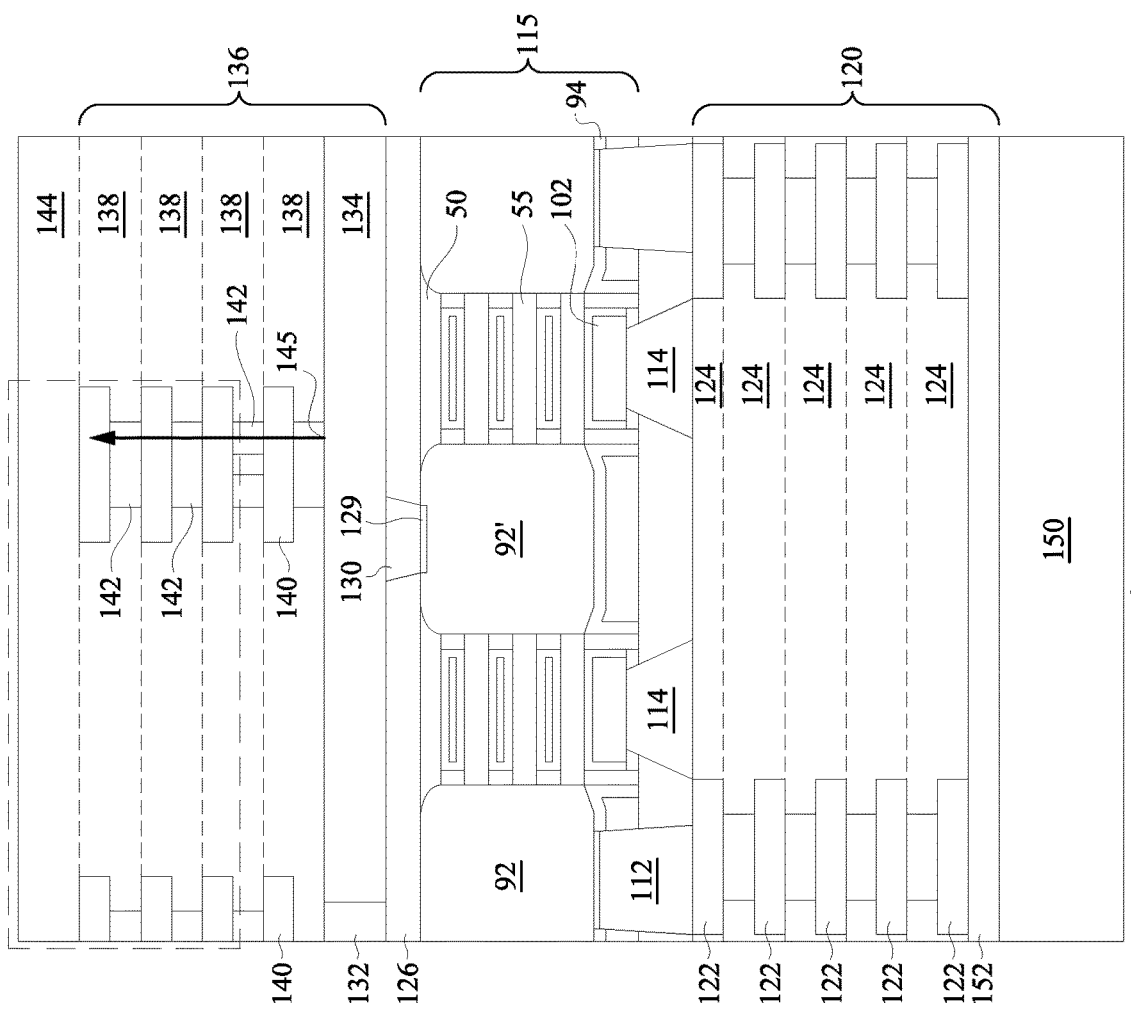

In FIG. 28, remaining portions of a backside interconnect structure 136 is formed over the dielectric layer 132 and the conductive lines 134. The backside interconnect structure 136 comprises the dielectric layers 126, 124, and 138; the contacts 130; the conductive features 140; and the conductive lines 134. The remainder of the backside interconnect structure 136 may be similar to the front-side interconnect structure 120. For example, the backside interconnect structure 136 may comprise similar materials and be formed using like processes as the interconnect structure 120. In particular, the interconnect structure 136 may comprise stacked layers of conductive features 140 formed in stacked dielectric layers 138. The conductive features 140 may include routing lines (e.g., for routing to and from subsequently formed contact pads and external connectors). Conductive features 140 may further include conductive vias that extend in the dielectric layers 138 to provide vertical interconnection between stacked layers of the conductive lines.

The conductive features 140 may further be patterned to include one or more embedded passive devices such as, resistors, capacitors, inductors, or the like. For example, in FIG. 28, the conductive features 140 comprise a metal-insulator-metal (MIM) inductor 140'. The embedded passive devices may be integrated with the conductive lines 134 (e.g., a power rail) to provide circuits (e.g., power circuits) on the backside of the nano-FETs.

The backside interconnect structure 136 may further include thermally conductive dummy features 142 that are part of a heat dissipation path from the active devices of the active device layer 115 and/or the conductive lines 134 (e.g., the power rail) through the backside interconnect structure 136. In FIG. 28, an arrow 145 indicates a thermal dissipation path from the power rail 134 through the backside interconnect structure 136. The thermal dissipation path extends at least from the power rail 134 to a surface of the interconnect structure 136 opposite the device layer 115. As a result, thermal conduction can be improved in the semiconductor device, and Joule heating resulting from the active devices and/or the conductive lines 134 can be reduced. For example, it has been observed that Joule heating in the resulting semiconductor device can be reduced by 300% or more by integrating the dummy features 142 into the backside interconnect structure 136.

In some embodiments, the dummy features 142 are dummy vias that extend through various ones of the dielectric layers 138, such as between the functional, conductive features 140. In some embodiments, the dummy features 142 may be disposed in one or more of the highest dielectric layers 138 (e.g., dielectric layers farthest from the device layer 115) of the backside interconnect structure 136. For example, the dummy features 142 may extend between stacked portions of an embedded passive device (e.g., the MIM inductor 140') of the conductive features 140 and/or the dummy features 142 may extend between stacked, and interconnected conductive lines (e.g., signal lines) of the conductive features 140 (see FIGS. 29A-C). The dummy features 142 are thermally connected to the active devices of the device layer 115 and/or the conductive lines 134 (e.g., a power rail). The dummy features 142, however, may be electrically isolated from all active devices in the device layer 115 and/or the conductive lines 134 in the semiconductor die. Alternatively, the dummy features 142 are electrically connected to one or more of the active devices in the device layer 115 and/or the conductive lines 134. In such embodiments, the dummy features 142 may be referred to as a dummy via because it is separate from the pattern of the embedded passive device (inductor 140')/conductive lines 140 in between which the dummy features are disposed and electrically connected. For example, the conductive features 140 may define one or more fully functional circuit(s), passive device(s), or the like that is distinct from the dummy features 142. In this manner, the dummy features 142 may be included in the backside interconnect 136 with affecting the layout of the existing functional features (e.g., signal lines, power lines, passive devices, or the like)

The dummy features 142 may comprise a thermally conductive material with a low thermal resistance, such as a metal (e.g., copper, aluminum, cobalt, tungsten, titanium, tantalum, ruthenium, or the like), a polymer, aluminum nitride, $Al_2O_3$, or the like. In some embodiments, the dummy features 142 have a thermal conductivity of at least about 398 watts per meter-kelvin (W/(m·K)) in order to provide sufficient heat dissipation in the semiconductor chip. The dummy features 142 may be formed concurrently with and from a same material composition as the conductive features 140, thereby improving manufacturing integration ease and reducing cost. In other embodiments, the dummy features 142 are formed of a different material than the conductive features 140, and the dummy features 142 in each of the dielectric layers 138 may be deposited before or after respective conductive features 140 in the respective dielectric layer 138.

Figure 29A:
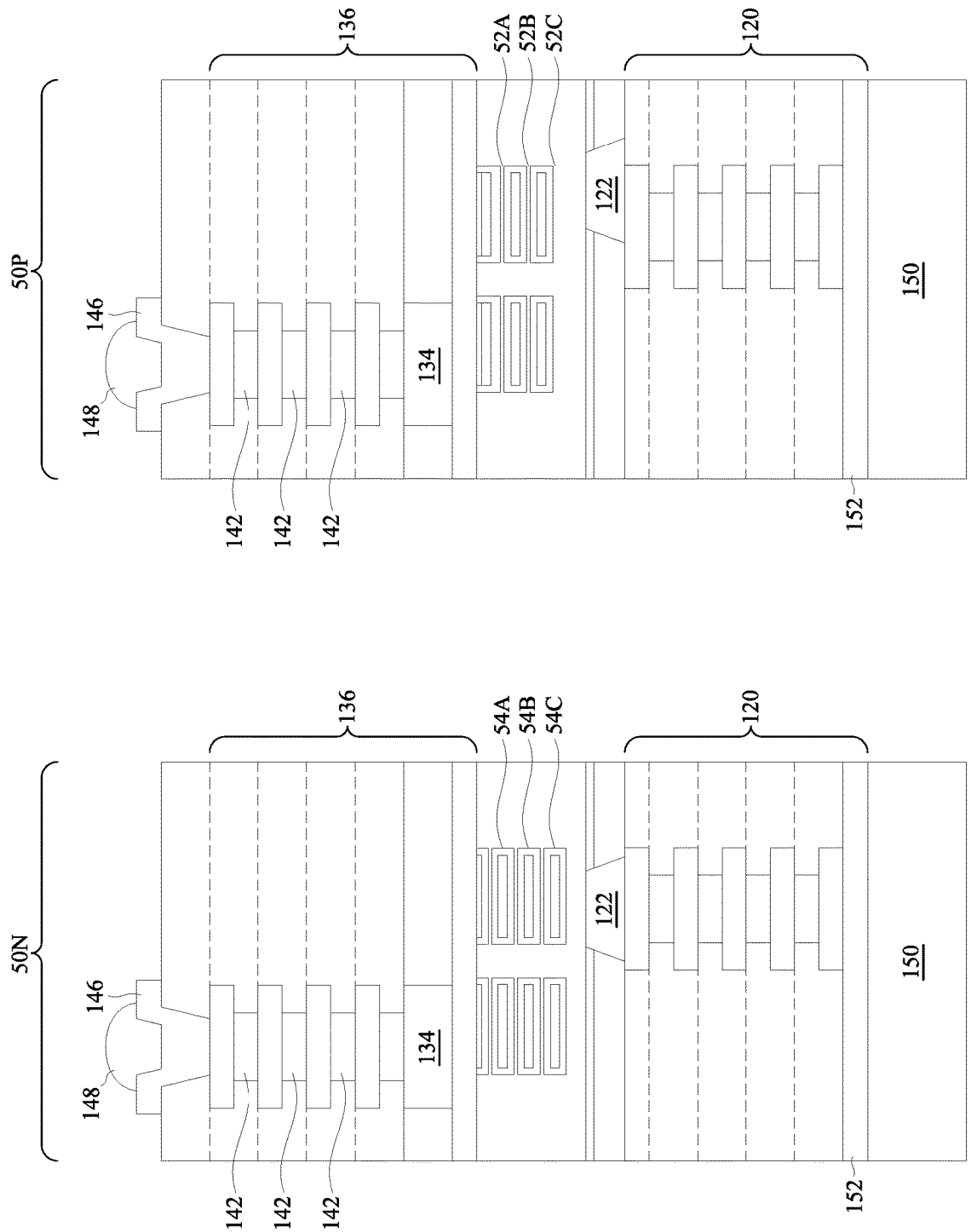
Figure 29B:
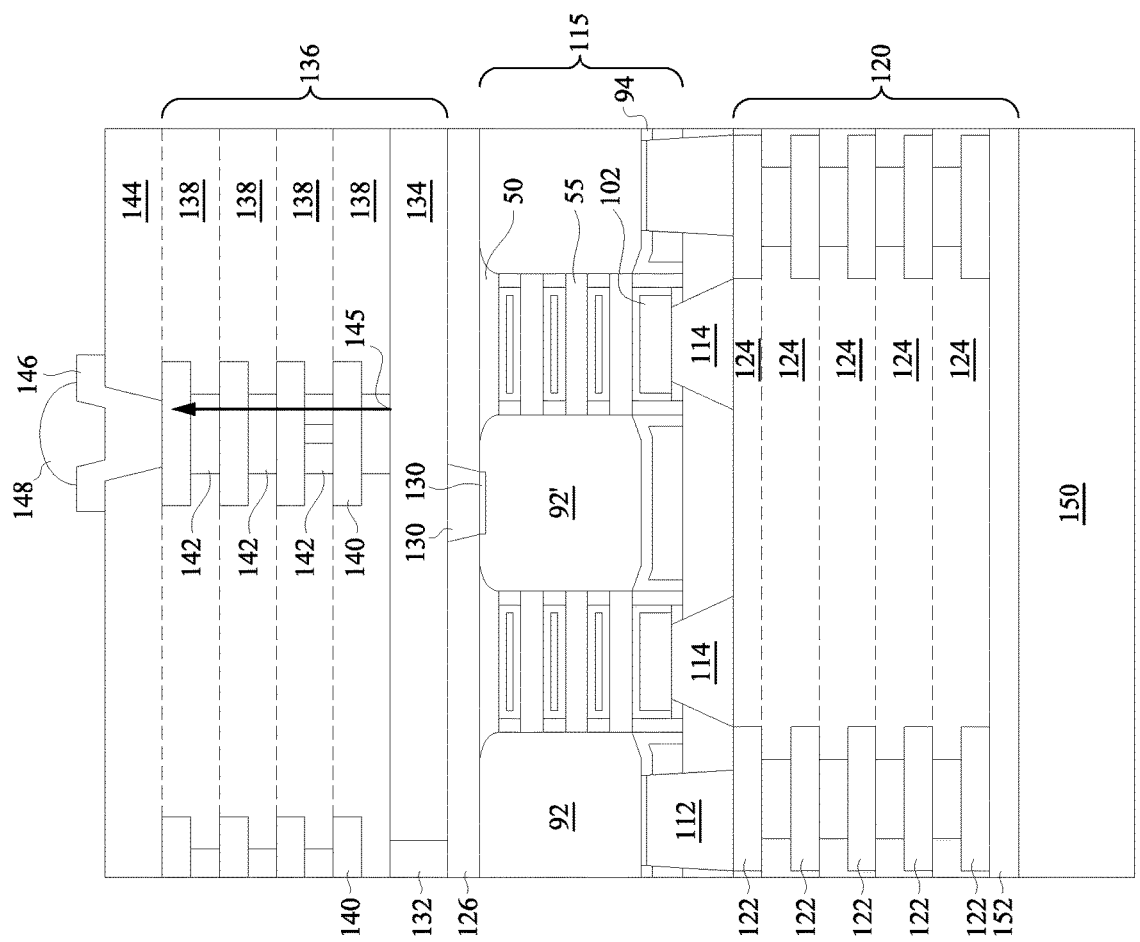
Figure 29C:
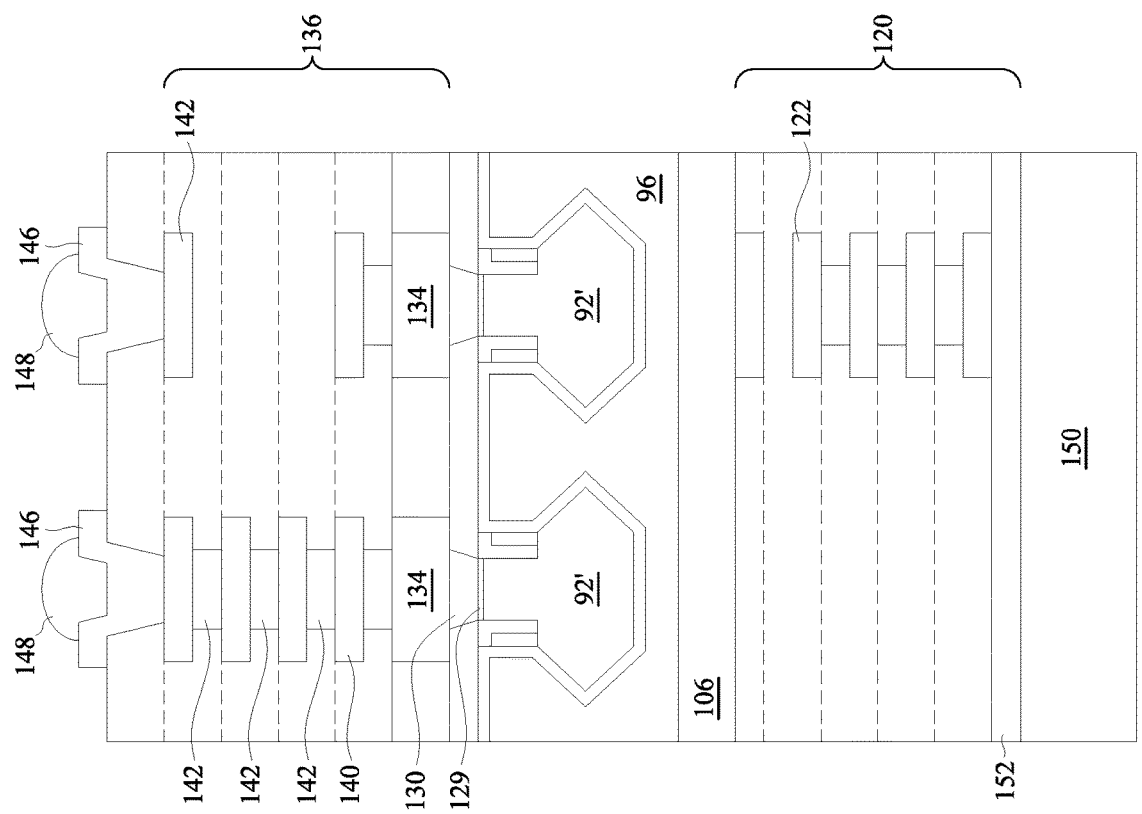

In FIGS. 29A-C, a passivation layer 144, UBMs 146, and external connectors 148 are formed over the interconnect structure 136. The passivation layer 144 may comprise polymers such as PBO, polyimide, BCB, or the like. Alternatively, passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

UBMs 146 are formed through the passivation layer 144 to the conductive features 140 in the interconnect structure 136, and external connectors 148 are formed on the UBMs 146. The UBMs 146 may comprise one or more layers of copper, nickel, gold, or the like, which are formed by a plating process, or the like. External connectors 148 (e.g., solder balls) are formed on the UBMs 146. The formation of external connectors 148 may include placing solder balls on the exposed portions of UBMs 146 and then reflowing the solder balls. In alternative embodiments, the formation of external connectors 148 includes performing a plating step to form solder regions over the topmost conductive feature 140 and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 148 and the external connectors 148 may also be referred to as backside input/output pads that may provide signal, supply voltage, and/or ground connections to the nano-FETs described above.

The UBMs 146 and the external connectors 148 may be thermally connected to the device layer 115 and/or the conductive lines 134 (e.g., power rails) by the dummy features 142. Thus, the dummy features 142 may help thermally conduct heat away from the active devices and/or the conductive lines 134 through the backside interconnect 136 to an exterior of the semiconductor die.

Figure 30A:
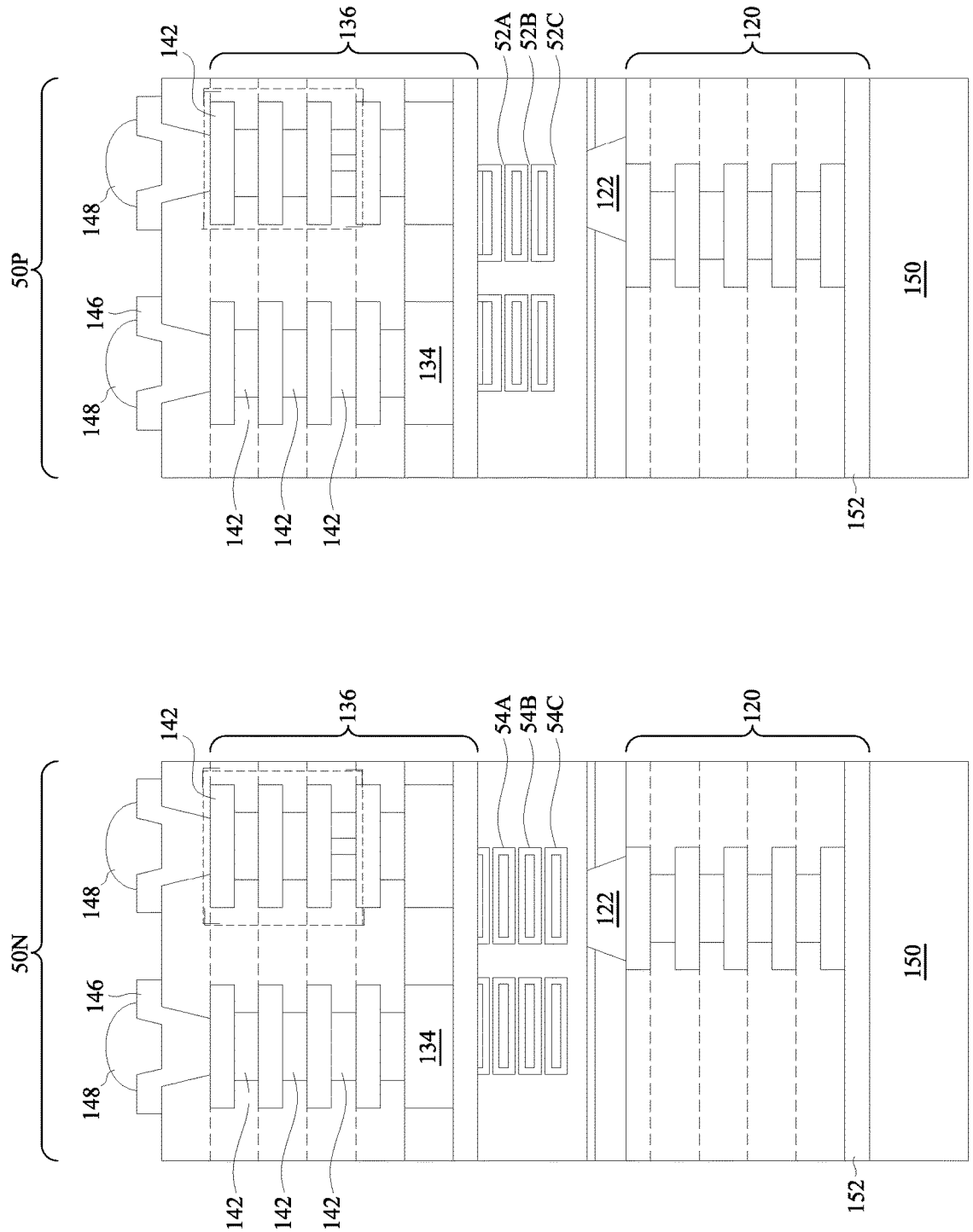
FIGS. 30A, 30B, and 30C are cross-sectional views of a semiconductor device in accordance with some embodiments.
Figure 30B:
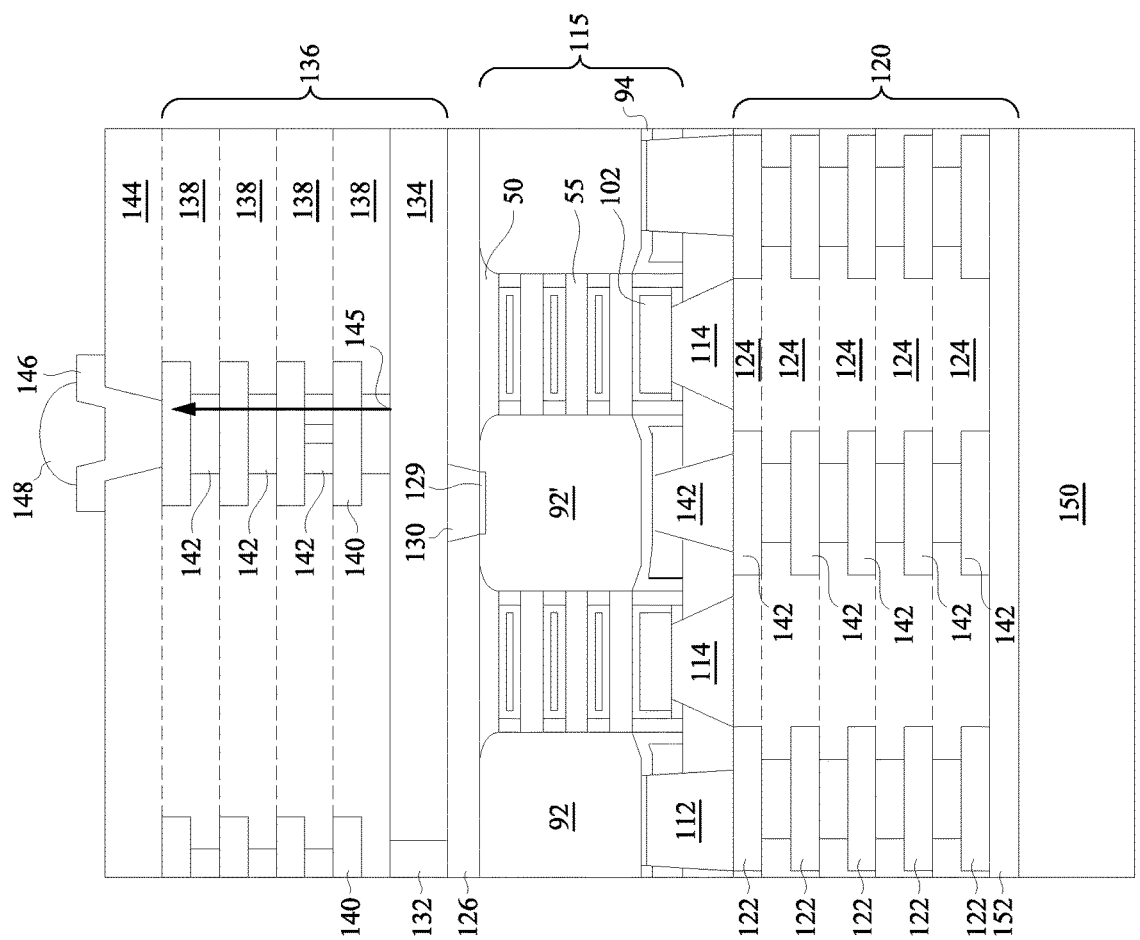
Figure 30C:
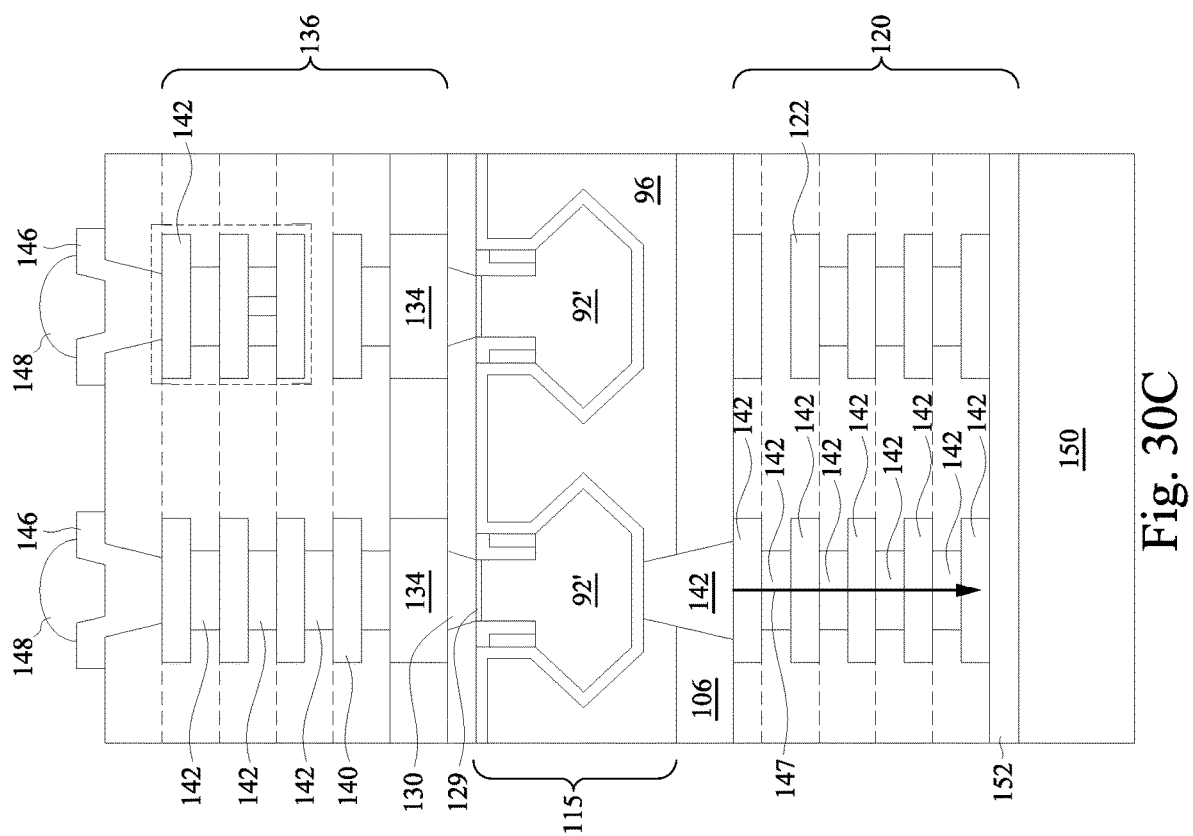

In FIGS. 29A-C, the dummy features 142 are illustrated as dummy vias that are included in the backside interconnect structure 136. FIGS. 30A-C illustrate an alternative configuration where the dummy features 142 include both dummy conductive lines and dummy conductive vias that are disposed in both the backside interconnect structure 136 and the front-side interconnect structure 120. In FIGS. 30A-C, like reference numerals indicate like elements formed using like processes as FIGS. 29A-C. The dummy features 142 may be inserted into previously unoccupied areas of the backside interconnect structure 136 and/or the front-side interconnect structure 140. Accordingly, the layout of functional elements of the semiconductor die (e.g., signal lines, power lines, passive devices, and the like) are unaffected by the inclusion of the dummy features 142.

In some embodiments, the dummy features 142 in the interconnect structure 120 may be electrically isolated from the active devices of the device layer 115 by, for example, the CESL 94. The dummy features 142 in the interconnect structure 120 may provide a thermal dissipation path from the device layer 115 through the interconnect structure 120 as indicated by arrow 147. In some embodiments, the dummy features 142 in the device layer 115 may provide a thermal dissipation path from the device layer 115 to the carrier substrate 150 for additional heat dissipation.

Figure 31:
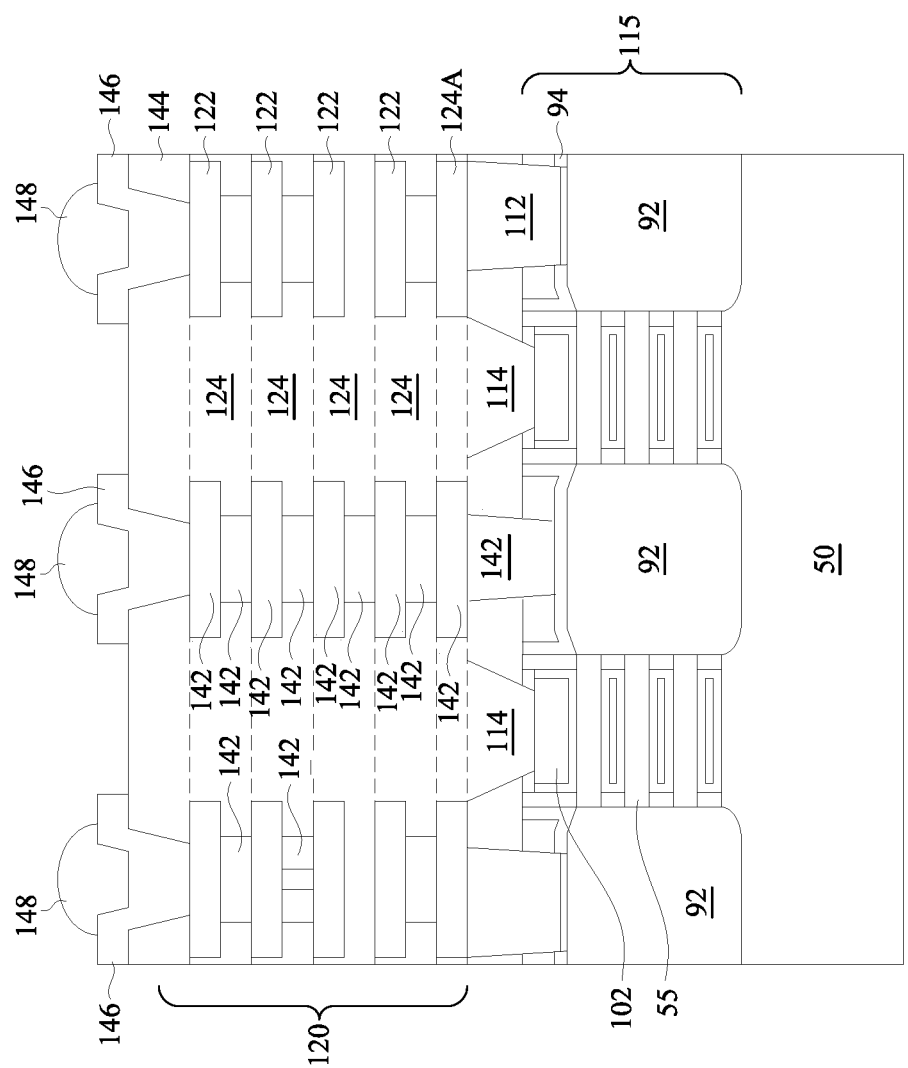
FIG. 31 is a cross-sectional view of a semiconductor device in accordance with some embodiments.

FIG. 31 may illustrate a similar structure as FIGS. 29A-C where like reference numerals indicate like elements formed using lime processes. However, in FIG. 31, the backside interconnect structure 136 is omitted, and the dummy features 142 are formed in the front-side interconnect structure 120. The passivation layer 144, the UBMs 146, and the external connectors 148 may be formed on the front-side interconnect structure 120, and may be electrically connected to the conductive features 122 of the front-side interconnect structure 120.

In the embodiments of FIG. 31, power rails may be disposed in a bottommost dielectric layer 124A of the interconnect structure 120, for example. The dummy features 142 may provide thermal dissipation paths from the active devices of the device layer 115 on the substrate 50 and/or the power rails in the dielectric layer 124A, through the front-side interconnect structure 120, to the UMBs 146/external connectors 148. The dummy features 142 may be inserted into areas of the front-side interconnect structure 140 that are unoccupied by functional circuit elements. Accordingly, the layout of functional elements of the semiconductor die (e.g., signal lines, power lines, passive devices, and the like) are unaffected by the inclusion of the dummy features 142. In some embodiments, the dummy features 142 may be electrically isolated from the active devices on the substrate 50 by, for example, the CESL 94.

Various embodiments provide thermal conductive paths from a device that generates heat (e.g., a transistor, resistor, or the like) to an exterior of the chip, thereby allowing for improved heat dissipation and compensating for operating temperature increases. In some embodiments, the thermal conductive paths include dummy features formed in an interconnect structure on a backside and/or front-side of a semiconductor chip.

In some embodiments, a device includes a device layer comprising a first transistor; a first interconnect structure on a front-side of the device layer; and a second interconnect structure on a backside of the device layer. The second interconnect structure includes a first dielectric layer on the backside of the device layer; a contact extending through the first dielectric layer to a source/drain region of the first transistor; a conductive line electrically connected to the source/drain region of the first transistor through the contact; and a thermal dissipation path thermally connected to the device layer, the thermal dissipation path extending to a surface of the second interconnect structure opposite the device layer. The thermal dissipation path comprises a dummy via. The device of claim 1, wherein the second interconnect structure comprises a passive device, and wherein the dummy via extends from a first portion of the passive device to a second portion of the passive device, the first portion of the passive device and the second portion of the passive device are disposed in different dielectric layers of the second interconnect structure. Optionally, in some embodiments, the second interconnect structure comprises a passive device, and the dummy via extends from a first portion of the passive device to a second portion of the passive device, the first portion of the passive device and the second portion of the passive device are disposed in different dielectric layers of the second interconnect structure. Optionally, in some embodiments, the passive device is an inductor. Optionally, in some embodiments, the thermal dissipation path is thermally connected to the conductive line. Optionally, in some embodiments, the conductive line is a power rail. Optionally, in some embodiments, the device further includes a passivation layer on the surface of the second interconnect structure opposite the device layer; an underbump metallization (UBM) in the passivation layer; and an external connector on the UBM, wherein the UBM and the external connector are thermally connected to the thermal dissipation path. Optionally, in some embodiments, the dummy via is disposed in a second dielectric layer of the second interconnect structure, and the passivation layer contacts the second dielectric layer. Optionally, in some embodiments, the device further includes a semiconductor substrate on a surface of the first interconnect structure opposite the device layer. Optionally, in some embodiments, the first interconnect structure comprises a conductive line electrically connected to a second transistor of the device layer; and a second thermal dissipation path thermally connected to the first transistor and the second transistor, the second thermal dissipation path comprises a second dummy via.

In some embodiments, a device includes a substrate; a first interconnect structure over the substrate; a device layer over the first interconnect structure, wherein the device layer comprises a first transistor and a second transistor, the first transistor is electrically connected to a conductive feature in the first interconnect structure; a second interconnect structure over the device layer, the second interconnect structure comprising: a power rail electrically connected to a source/drain region of the second transistor through a backside source/drain contact; and a dummy via in a first dielectric layer, the dummy via is thermally connected to the power rail; a passivation layer contacting the first dielectric layer of the second interconnect structure; and a underbump metallization (UBM) in the passivation layer, the UBM is thermally connected to the power rail through the dummy via.

Optionally, in some embodiments, the dummy via is further thermally connected to the device layer. Optionally, in some embodiments, the dummy via extends from a first portion of an inductor to a second portion of the inductor, the first portion of the inductor is disposed in the first dielectric layer, and the second portion of the inductor is disposed in a second dielectric layer under the first dielectric layer. Optionally, in some embodiments, the device further comprises a second dummy via in the second dielectric layer, the second dummy via is thermally connected to the power rail. Optionally, in some embodiments, the dummy via extends from a first conductive line to a second conductive line, the first conductive line is disposed in the first dielectric layer, and the second conductive line is disposed in a second dielectric layer under the first dielectric layer.

In some embodiments, a method includes forming a transistor on a semiconductor substrate; thinning the semiconductor substrate to expose a source/drain region of the transistor; after thinning the semiconductor substrate, forming a first interconnect structure on a backside of the transistor, wherein forming the first interconnect structure comprises: depositing a first dielectric layer on a backside of the transistor; forming a contact through the first dielectric layer, the contact is electrically connected to a source/drain region of the transistor; forming a conductive line electrically connected to the contact; and forming a thermal dissipation path from the conductive line to a surface of the first interconnect structure opposite the transistor, wherein the thermal dissipation path comprises a dummy via; and forming an external connector over the first interconnect structure, the external connector is thermally connected to the conductive line through the dummy via. Optionally, in some embodiments, the conductive line is a power rail. Optionally, in some embodiments, the method further includes forming a passive device in the first interconnect structure, wherein the dummy via extends between stacked portions of the passive device. Optionally, in some embodiments, the dummy via has a same material composition as the passive device. Optionally, in some embodiments, the method further includes prior to thinning the semiconductor substrate, forming a second interconnect structure on a front-side of the semiconductor substrate; and bonding a carrier substrate to a surface of the second interconnect structure opposite the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a device layer comprising a first transistor;
   a first interconnect structure on a front-side of the device layer;
   a second interconnect structure on a backside of the device layer, the second interconnect structure comprising:
      a first dielectric layer on the backside of the device layer;
      a contact extending through the first dielectric layer to a source/drain region of the first transistor;
      a conductive line electrically connected to the source/drain region of the first transistor through the contact; and
      a thermal dissipation path thermally connected to the device layer, the thermal dissipation path extending to a surface of the second interconnect structure opposite the device layer, wherein the thermal dissipation path comprises a dummy via.

2. The device of claim 1, wherein the second interconnect structure comprises a passive device, and wherein the dummy via extends from a first portion of the passive device to a second portion of the passive device, the first portion of the passive device and the second portion of the passive device are disposed in different dielectric layers of the second interconnect structure.

3. The device of claim 2, wherein the passive device is an inductor.

4. The device of claim 1, wherein the thermal dissipation path is thermally connected to the conductive line.

5. The device of claim 1, wherein the conductive line is a power rail.

6. The device of claim 1 further comprising:
   a passivation layer on the surface of the second interconnect structure opposite the device layer;
   an underbump metallization (UBM) in the passivation layer; and
   an external connector on the UBM, wherein the UBM and the external connector are thermally connected to the thermal dissipation path.

7. The device of claim 6, wherein the dummy via is disposed in a second dielectric layer of the second interconnect structure, and wherein the passivation layer contacts the second dielectric layer.

8. The device of claim 1 further comprising a semiconductor substrate on a surface of the first interconnect structure opposite the device layer.

9. The device of claim 8, wherein the first interconnect structure comprises:
   a conductive line electrically connected to a second transistor of the device layer; and
   a second thermal dissipation path thermally connected to the first transistor and the second transistor, the second thermal dissipation path comprises a second dummy via.

10. A device comprising:
    a substrate;
    a first interconnect structure over the substrate;
    a device layer over the first interconnect structure, wherein the device layer comprises a first transistor and a second transistor, the first transistor is electrically connected to a conductive feature in the first interconnect structure;
    a second interconnect structure over the device layer, the second interconnect structure comprising:
       a power rail electrically connected to a source/drain region of the second transistor through a backside source/drain contact; and
       a dummy via in a first dielectric layer, the dummy via is thermally connected to the power rail;
    a passivation layer contacting the first dielectric layer of the second interconnect structure; and
    an underbump metallization (UBM) in the passivation layer, the UBM is thermally connected to the power rail through the dummy via.

11. The device of claim 10, wherein the dummy via is further thermally connected to the device layer.

12. The device of claim 10, wherein the dummy via extends from a first portion of an inductor to a second portion of the inductor, the first portion of the inductor is disposed in the first dielectric layer, and the second portion of the inductor is disposed in a second dielectric layer under the first dielectric layer.

13. The device of claim 12 further comprising a second dummy via in the second dielectric layer, the second dummy via is thermally connected to the power rail.

14. The device of claim 10, wherein the dummy via extends from a first conductive line to a second conductive line, the first conductive line is disposed in the first dielectric layer, and the second conductive line is disposed in a second dielectric layer under the first dielectric layer.

15. A device comprising:
   a device layer comprising a transistor;
   a first interconnect structure on a front side of the device layer; and
   a second interconnect structure on a backside of the device layer, the second interconnect structure comprising:
      a power rail;
      a source/drain contact electrically connecting a source/drain region of the transistor to the power rail; and
      a dummy via thermally connecting the device layer to a surface of the second interconnect structure opposite to the device layer.

16. The device of claim 15, wherein the second interconnect structure further comprises a passive device, and wherein the dummy via extends between stacked portions of the second interconnect structure.

17. The device of claim 16, wherein the dummy via has a same material composition as the passive device.

18. The device of claim 16, wherein the passive device is an inductor.

19. The device of claim 15 further comprising an carrier substrate bonded to the first interconnect structure, wherein the carrier substrate and the device layer are disposed on opposing sides of the first interconnect structure.

20. The device of claim 15 further comprising:
   a passivation layer on the surface of the second interconnect structure opposite the device layer;
   an underbump metallization (UBM) in the passivation layer; and
   an external connector on the UBM, wherein the UBM and the external connector are thermally connected to the device layer by the dummy via.

* * * * *